(12) United States Patent
Retterath

(10) Patent No.: US 12,230,649 B2
(45) Date of Patent: Feb. 18, 2025

(54) AI SYSTEM ON CHIP (SOC) FOR ROBOTICS VISION APPLICATIONS

(71) Applicant: Vergence Automation, Inc., Excelsior, MN (US)

(72) Inventor: James E. Retterath, Excelsior, MN (US)

(73) Assignee: Vergence Automation, Inc., Excelsior, MN (US)

( * ) Notice: Subject to any disclaimer, the term of this patent is extended or adjusted under 35 U.S.C. 154(b) by 467 days.

(21) Appl. No.: 17/324,964

(22) Filed: May 19, 2021

(65) Prior Publication Data

US 2021/0366952 A1 Nov. 25, 2021

Related U.S. Application Data

(60) Provisional application No. 63/027,227, filed on May 19, 2020.

(51) Int. Cl.
*H01L 27/144* (2006.01)
*G06F 9/30* (2018.01)
(Continued)

(52) U.S. Cl.
CPC ...... *H01L 27/1446* (2013.01); *G06F 9/30101* (2013.01); *G06N 5/04* (2013.01); *H01L 27/14643* (2013.01)

(58) Field of Classification Search
CPC .......... H01L 27/1446; H01L 27/14643; H01L 27/14634; G06F 9/30101; G06N 5/04; G06N 3/045; H04N 25/75
See application file for complete search history.

(56) References Cited

U.S. PATENT DOCUMENTS 6,765,566 B1 7/2004 Tsao
7,634,061 B1 12/2009 Tumer et al.
(Continued)

FOREIGN PATENT DOCUMENTS

DE 102018107801 A1 10/2018
KR 10-2016-0135482 A 11/2016
(Continued)

OTHER PUBLICATIONS

Krestinskaya, O. and Pappachen James, A., "Real-time Analog Pixel-to-pixel Dynamic Frame Differencing with Memristive Sensing Circuits", arXiv e-prints, arXiv:1808.06780v1 [cs.ET], Aug. 21, 2018, doi: 10.48550/arXiv.1808.06780. (Year: 2018).*
(Continued)

*Primary Examiner* — Benjamin P Sandvik
*Assistant Examiner* — John Patrick Cornely
(74) *Attorney, Agent, or Firm* — Barnes & Thornburg LLP

(57) ABSTRACT

An Artificial Intelligence (AI) multi-frame imaging System on Chip (SoC) incorporates in-pixel embedded analog image processing by performing analog image computation within a multi-frame image pixel. In embodiments, each in-pixel processing element includes a photodetector, photodetector control circuitry with at least three analog sub-frame storage elements, analog circuitry configured to process both neighbor-in-space and neighbor-in-time functions for analog data, and a set of north-east-west-south (NEWS) registers, each register interconnected between a unique pair of neighboring in-pixel processing elements to transfer analog data between the pair of neighboring in-pixel processing elements. In embodiments, the in-pixel embedded analog image processing device takes advantage of high parallelism because each pixel has its own processor, and takes advantage of locality (Continued)

of data because all data is located within a pixel or within a neighboring pixel.

13 Claims, 17 Drawing Sheets

(51) Int. Cl.
*G06N 5/04* (2023.01)
*H01L 27/146* (2006.01)

(56) References Cited

U.S. PATENT DOCUMENTS

| | | | |
|---|---|---|---|
| 8,102,426 B2 | 1/2012 | Yahav et al. | |
| 8,150,902 B2 | 4/2012 | Bates | |
| 8,543,254 B1 | 9/2013 | Schut et al. | |
| 8,629,387 B2 | 1/2014 | Pflibsen et al. | |
| 9,094,628 B2 | 7/2015 | Williams | |
| 9,185,363 B2 | 11/2015 | Murillo Amaya et al. | |
| 9,189,689 B2 | 11/2015 | Chandraker et al. | |
| 9,280,711 B2 | 3/2016 | Stein | |
| 9,294,754 B2 | 3/2016 | Billerbeck et al. | |
| 9,325,920 B2 | 4/2016 | Van Nieuwenhove et al. | |
| 9,367,922 B2 | 6/2016 | Chandraker et al. | |
| 9,513,768 B2 | 12/2016 | Zhao et al. | |
| 9,514,373 B2 | 12/2016 | Jeromin et al. | |
| 9,524,434 B2 | 12/2016 | Gee et al. | |
| 9,607,377 B2 | 3/2017 | Lovberg et al. | |
| 9,651,388 B1 | 5/2017 | Chapman et al. | |
| 9,671,243 B2 | 6/2017 | Stein | |
| 9,671,328 B2 | 6/2017 | Retterath et al. | |
| 9,734,414 B2 | 8/2017 | Samarasekera et al. | |
| 9,778,352 B2 | 10/2017 | Mizutani | |
| 9,797,734 B2 | 10/2017 | Mizutani et al. | |
| 9,811,731 B2 | 11/2017 | Lee et al. | |
| 9,824,586 B2 | 11/2017 | Sato et al. | |
| 9,836,657 B2 | 12/2017 | Hilldore et al. | |
| 9,842,254 B1 | 12/2017 | Brailovskiy et al. | |
| 9,846,040 B2 | 12/2017 | Hallberg | |
| 9,866,816 B2 | 1/2018 | Retterath | |
| 9,870,513 B2 | 1/2018 | Thiel et al. | |
| 9,870,624 B1 | 1/2018 | Narang et al. | |
| 9,902,401 B2 | 2/2018 | Stein et al. | |
| 9,905,024 B2 | 2/2018 | Shin et al. | |
| 9,928,605 B2 | 3/2018 | Bleiweiss et al. | |
| 9,934,690 B2 | 4/2018 | Kuroda | |
| 9,940,539 B2 | 4/2018 | Han et al. | |
| 9,943,022 B1 | 4/2018 | Alam | |
| 9,946,260 B2 | 4/2018 | Shashua et al. | |
| 9,953,227 B2 | 4/2018 | Utagawa et al. | |
| 9,959,595 B2 | 5/2018 | Livyatan et al. | |
| 9,971,953 B2 | 5/2018 | Li et al. | |
| 9,981,659 B2 | 5/2018 | Urano et al. | |
| 9,984,468 B2 | 5/2018 | Kasahara | |
| 9,992,468 B2 | 6/2018 | Osanai et al. | |
| 9,996,941 B2 | 6/2018 | Roumeliotis et al. | |
| 10,012,504 B2 | 7/2018 | Roumeliotis et al. | |
| 10,012,517 B2 | 7/2018 | Protter et al. | |
| 10,019,014 B2 | 7/2018 | Prasad et al. | |
| 10,019,635 B2 | 7/2018 | Kido et al. | |
| 10,025,984 B2 | 7/2018 | Rajkumar et al. | |
| 10,037,712 B2 | 7/2018 | Dayal | |
| 10,046,770 B1 | 8/2018 | Sabri | |
| 10,049,307 B2 | 8/2018 | Pankanti et al. | |
| 10,054,517 B2 | 8/2018 | Liu et al. | |
| 10,055,854 B2 | 8/2018 | Wan et al. | |
| 10,062,010 B2 | 8/2018 | Kutliroff | |
| 10,071,306 B2 | 9/2018 | Vandonkelaar | |
| 10,073,531 B2 | 9/2018 | Hesch et al. | |
| 10,215,856 B1 | 2/2019 | Xu | |
| 10,218,913 B2 | 2/2019 | Somasundaram et al. | |
| 10,302,768 B2 | 5/2019 | Godbaz et al. | |
| 10,382,742 B2 | 8/2019 | Retterath | |
| 10,397,552 B2 | 8/2019 | Van Nieuwenhove et al. | |
| 2011/0007160 A1 | 1/2011 | Okumura | |
| 2011/0285866 A1* | 11/2011 | Bhrugumalla | H04N 23/951 348/E5.024 |
| 2013/0215290 A1* | 8/2013 | Solhusvik | H04N 25/70 348/E9.053 |
| 2014/0126769 A1 | 5/2014 | Reitmayr et al. | |
| 2014/0218480 A1 | 8/2014 | Knighton et al. | |
| 2014/0347448 A1 | 11/2014 | Hegemann et al. | |
| 2016/0189372 A1 | 6/2016 | Lovberg et al. | |
| 2016/0255289 A1 | 9/2016 | Johnson et al. | |
| 2017/0230638 A1 | 8/2017 | Rhoads et al. | |
| 2017/0236037 A1 | 8/2017 | Wajs et al. | |
| 2017/0323429 A1 | 11/2017 | Godbaz et al. | |
| 2018/0031681 A1 | 2/2018 | Yoon et al. | |
| 2018/0063508 A1 | 3/2018 | Trail et al. | |
| 2018/0113200 A1 | 4/2018 | Steinberg et al. | |
| 2018/0176514 A1 | 6/2018 | Kirmani et al. | |
| 2018/0188059 A1 | 7/2018 | Wheeler et al. | |
| 2018/0330526 A1 | 11/2018 | Corcoran | |
| 2018/0358393 A1* | 12/2018 | Sato | H01L 27/14687 |
| 2019/0033448 A1 | 1/2019 | Molnar et al. | |
| 2019/0056498 A1 | 2/2019 | Sonn et al. | |
| 2019/0230297 A1 | 7/2019 | Knorr et al. | |
| 2019/0286153 A1 | 9/2019 | Rankawat et al. | |
| 2020/0057146 A1 | 2/2020 | Steinkogler et al. | |
| 2020/0278194 A1 | 9/2020 | Kawahito | |

FOREIGN PATENT DOCUMENTS

| | | |
|---|---|---|
| WO | WO 2018/127789 A1 | 7/2018 |
| WO | WO 2020/198134 A1 | 10/2020 |

OTHER PUBLICATIONS

P. Dudek and P. J. Hicks, "A general-purpose processor-per-pixel analog SIMD vision chip," in IEEE Transactions on Circuits and Systems I: Regular Papers, vol. 52, No. 1, pp. 13-20, Jan. 2005, doi: 10.1109/TCSI.2004.840093. (Year: 2005).*
Abuelsamid, "Bosch Launches Silicon Carbide Chips to Make Evs More Efficient," Forbes, Oct. 13, 2019, (accessed at https://www.forbes.com/sites/samabuelsamid/2019/10/13/bosch-launches-silicon-carbide-chips-to-make-evs-more-efficient/amp/), 7 pages.
Barati et al., "Hot Carrier-Enhanced Interlayer Electron-Hole Pair Multiplication in 2D Semiconductor Heterostructure Photocells," Nature Nanotechnology, Oct. 9, 2017, 7 pages.
Becker et al., "Smartphone Video Guidance Sensor for Small Satellites," NASA Marshall Space Flight Center, 27th Annual AIAA/USU Conference on Small Satellites, Aug. 2013, 8 pages.
Bie et al., A MoTe2-Based Light-Emitting Diode and Photodetecto for Silicon Phototonic Integrated Circuits, Nature Nanotechnology, Oct. 23, 2017, 8 pages.
Dionne et al., "Silicon-Based Plasmonics for On-Chip Phototonics," IEEE Journal, Jan.-Feb. 2010, 13 pages.
Dudek et al., "A General-Purpose CMOS Vision Chip with a Process-Per-Pixel SIMD Array," Computer Science, 2001, 4 pages.
Dudek, "Adaptive Sensing and Image Processing with a General-Purpose Pixel-Parallel Sensor/Processor Array Integrated Circuit," University of Manchester, 2006, 6 pages.
Evans, "Cascading Individual Analog Counters," Radiant Technologies, Inc., Oct. 2016, 7 pages.
Foix et al., "Exploitation of Time-of-Flight (ToF) Camera," IRI Technical Report, 2007, 22 pages.
Hall et al., "Guide for Pavement Friction," NCHRP, National Academies of Sciences, Engineering, and Medicine, 2009, 257 pages.
Martel et al., "Parallel HDR Tone Mapping and Auto-Focus on a Cellular Processor Array Vision Chip," 2016 IEEE International Symposium on Circuits and Systems, May 2016, 4 pages.
Panina et al., "Compact CMOS Analog Counter for SPAD Pixel Arrays," IEEE, Apr. 2014, 5 pages.
Peizerat et al., "An Analog Counter Architecture for Pixel-Level ADC," CEA/LETI-MINATEC, 2009, 3 pages.
Pinson et al., "Orbital Express Advanced Video Guidance Sensor: Ground Testing, Flight Results and Comparisons," NASA Marshall Space Flight Center, American Institute of Aeronautics and Astronautics, Aug. 2008, 12 pages.

(56) References Cited

OTHER PUBLICATIONS

Sun et al., "Single-Chip Microprocessor that Communicates Directly Using Light," Nature, Dec. 23, 2015, 29 pages.
Tang et al., "2D Materials for Silicon Photonics," Nature Nanotechnology, Oct. 23, 2017, 2 pages.
Torrens, "4QD-TEC: Electronics Circuits Reference Archive Analogue Pulse Counter," [undated], 2 pages.
University of Bonn., "Teaching Cars to Drive with Foresight: Self-Learning Process," Science Daily, Oct. 2019, 4 pages.
Vijayaraghavan et al., "Design for MOSIS Educational Program (Research)," EE Department, University of Tennessee, [undated], 8 pages.
Wong et al., "Analog Vision—Neural Network Inference Acceleration Using Analog SIMD Computation in the Focal Plane," Imperial College London, Diplomarbeit, 2018, 112 pages.
Wong, the SCAMP-5 Vision Chip is a Focal-Plane Sensor-Processor (FPSP) developed at the University of Manchester (Carey et al., 2013a), 6 pages.

* cited by examiner

AI SYSTEM ON CHIP (SOC) FOR ROBOTICS VISION APPLICATIONS

FIELD OF THE INVENTION

The present disclosure relates to in-pixel image processing. More particularly, the present disclosure relates to utilizing programmable analog computing elements for in-pixel image processing for multi-frame imaging.

BACKGROUND OF THE INVENTION

Three-dimensional (3D) cameras, four-dimensional (4D) cameras, and related high performance multi-frame imaging systems are capable of providing more than just two-dimensional images of a scene. Multi-frame imaging systems can provide, for example, distance measurements, motion measurements, and/or photonic measurements for physical objects in a scene. An example of a multi-frame camera system that generates lighting-invariant depth maps for in-motion applications and attenuating environments is disclosed in U.S. Pat. No. 10,873,738 (Retterath).

On-chip or in-sensor image processing has been used to: 1) increase the performance of image processing by adding computing parallelism, 2) reduce the amount of information sent from a sensor, and/or 3) reduce the power consumption for image processing.

One of the earliest on-chip image processing systems was the SCAMP chip. (Piotr Dudek, "A General-Purpose Processor-per-Pixel Analog SIMD Vision Chip", IEEE Transactions on Circuits and Systems-I: Regular Papers, Vol. 51, No. 1, January 2005). The most current version of SCAMP chip is the SCAMP-5 chip which features a high speed analog VLSI image acquisition and low-level image processing system. The architecture of the SCAMP-5 chip is based on a dynamically reconfigurable SIMD processor array that features a massively parallel architecture enabling the computation of programmable mask-based image processing in each pixel. (Wong, the SCAMP-5 Vision Chip is a Focal-Plane Sensor-Processor (FPSP) developed at the University of Manchester (Carey et al., 2013a), 6 pages). The chip can capture raw images up to 10,000 fps and runs low-level image processing at a frame rate of 2,000-5,000 fps.

Various examples of on-chip processing systems for high performance imaging systems are described U.S. Pat. Nos. 8,102,426, 8,629,387, 9,094,628, and 10,218,913, U.S. Publ. Appl. US2019/0056498A1, and Martel et al. ("Parallel HDR Tone Mapping and Auto-Focus on a Cellular Processor Array Vision Chip," 2016 IEEE International Symposium on Circuits and Systems, May 2016, 4 pages).

In view of limitations in the art, it is desirable to have a sensing and computing system for multi-frame imaging that performs in-pixel computing for high parallelism, reduced information flow, and reduced power consumption.

SUMMARY OF THE INVENTION

Neighbor-in-space image processing, which relies on convolution of information from neighboring pixels within an image, has led to advances in signal processing, artificial intelligence, and machine learning. Neighbor-in-time image processing for single-frame images, which relies on recursive computing to identify commonality and differences between successive images in an imaging sequence, has led to advances in object tracking, visual odometry, and Structure from Motion. Neighbor-in-time image processing for multi-frame images has led to advances in HDR (high dynamic range) sensing, XDR (extended Dynamic Range) sensing, and 3D imaging.

In contrast to conventional neighbor-in-time and neighbor-in-space processing that is performed off-sensor and uses significant computational and power resources, various embodiment as disclosed provide for in-pixel embedded analog image processing whereby computation is performed within an image pixel takes advantage of high parallelism because each pixel has its own processor, and takes advantage of locality of data because all data is located within a pixel or within a neighboring pixel. Embodiments of in-pixel embedded analog image processing also provide reduced power consumption because fewer transistors are energized for math, logic and register transfer operations with analog computing than the equivalent operations in a digital processing environment.

In embodiments, an in-pixel analog image processing device comprises an array of analog in-pixel processing elements. Each in-pixel processing element includes a photodetector, photodetector capture circuitry, analog circuitry configured to process both neighbor-in-space and neighbor-in-time functions for analog data representing an electrical current from the photodetector capture circuitry, and a set of north-east-west-south (NEWS) registers, each register interconnected between a unique pair of neighboring in-pixel processing elements to transfer analog data between the pair of neighboring in-pixel processing elements.

In embodiments, a sub-frame imaging pixel is implemented in a four-substrate hardware configuration whereby information flows from a photodetector substrate to a photodetector control (PDC) substrate to an analog pixel processing (APP) substrate to a digital memory substrate. In various embodiments, circuitry within the PDC substrate can be controlled by instruction bits from a PDC instruction word and circuitry within the APP substrate can be controlled by instruction bits from an APP instruction word. In various embodiments, circuitry within the APP substrate performs neighbor-in time processing on sub-frames, performs neighbor-in-time processing on frames within a stream of frames, and performs neighbor-in-space processing by utilizing analog North-East-West-South (NEWS) connection registers for transfer of information to/from neighboring pixels. In embodiments, the pitch of the four-substrate, sub-frame imaging pixels ranges from 1.5 μm to 40 μm.

In embodiments, a sub-frame imaging pixel is implemented in a single-substrate hardware configuration whereby information flows from a photodetector to PDC circuitry to APP circuitry to digital memory. In various embodiments, the PDC circuitry is controlled by instruction bits from a PDC instruction word and the APP circuitry is controlled by instruction bits from an APP instruction word. In various embodiments, APP circuitry performs neighbor-in time processing on sub-frames, performs neighbor-in-time processing on frames within a stream of frames, and performs neighbor-in-space processing by utilizing analog NEWS registers for transfer of information to/from neighboring pixels. In embodiments, the pitch of the single-substrate, sub-frame imaging pixels ranges from 1.5 μm to 40 μm.

In embodiments, a sub-frame imaging pixel is implemented in a two-substrate hardware configuration whereby information flows from a first photodetector substrate to a second substrate that includes PDC circuitry, APP circuitry, and digital memory. In various embodiments, the PDC circuitry is controlled by instruction bits from a PDC instruction word and the APP circuitry is controlled by instruction bits from an APP instruction word. In various embodiments, APP circuitry performs neighbor-in time processing on sub-frames, performs neighbor-in-time processing on frames within a stream of frames, and performs neighbor-in-space processing by utilizing analog NEWS registers for transfer of information to/from neighboring pixels. In embodiments, the first photodetector substrate contains a plurality of bottom-side bonding pads for each photodetector and the second substrate contains a plurality of top-side bonding pads for photodetector input. During substrate integration, top-side bonding pads and bottom-side bonding pads are aligned without the use of an interconnect layer and are bonded directly to one-another. In embodiments, the pitch of the two-substrate, sub-frame imaging pixels ranges from 1.5 µm to 40 µm.

In embodiments, a sub-frame imaging pixel is implemented in a two-substrate hardware configuration, the two substrates having non-aligned bonding pads due to pixel pitch differences or other layout differences, whereby information flows from a first photodetector substrate to a second substrate that includes PDC circuitry, APP circuitry, and digital memory. In various embodiments, the PDC circuitry is controlled by instruction bits from a PDC instruction word and the APP circuitry is controlled by instruction bits from an APP instruction word. In various embodiments, APP circuitry performs neighbor-in time processing on sub-frames, performs neighbor-in-time processing on frames within a stream of frames, and performs neighbor-in-space processing by utilizing analog NEWS registers for transfer of information to/from neighboring pixels. In embodiments, the first photodetector substrate contains a plurality of bottom-side bonding pads for each photodetector and the second substrate contains a plurality of top-side bonding pads for photodetector input. During substrate integration, an interposer or other electrical connection component is used to align top-side bonding pads and bottom-side bonding pads. In embodiments, the pixel pitch of the photodetector substrate of the two-substrate, sub-frame imaging pixels ranges from 1.5 µm to 40 µm.

DETAILED DESCRIPTION OF THE EMBODIMENTS

This disclosure claims priority to U.S. Provisional Application 63/027,227, the contents of which are hereby incorporated by reference in its entirety.

For purposes of describing the various embodiments, the following terminology and references may be used with respect to analog sub-frame pixel processing in accordance with one or more embodiments as described.

"CPU" means central processing unit.
"GPU" means graphics processing unit.
"APU" means associative processing unit.
"VPU" means vision processing unit.
"QNN" and "Quantized Neural Network" refer to a hardware and software architecture that utilizes highly-parallelized computing with very limited instruction types.

"Module" refers to a software component that performs a particular function. A module, as defined herein, may execute on various hardware components.

"Component" refers to a hardware construct that may execute software contained within a module. A component may include a CPU, GPU, VPU, NNE or other digital computing capability. A component may contain all digital electronics, all analog electronics, mixed signal electronics, all optical computing elements, or mixed signal and optical computing elements.

Figure 1:
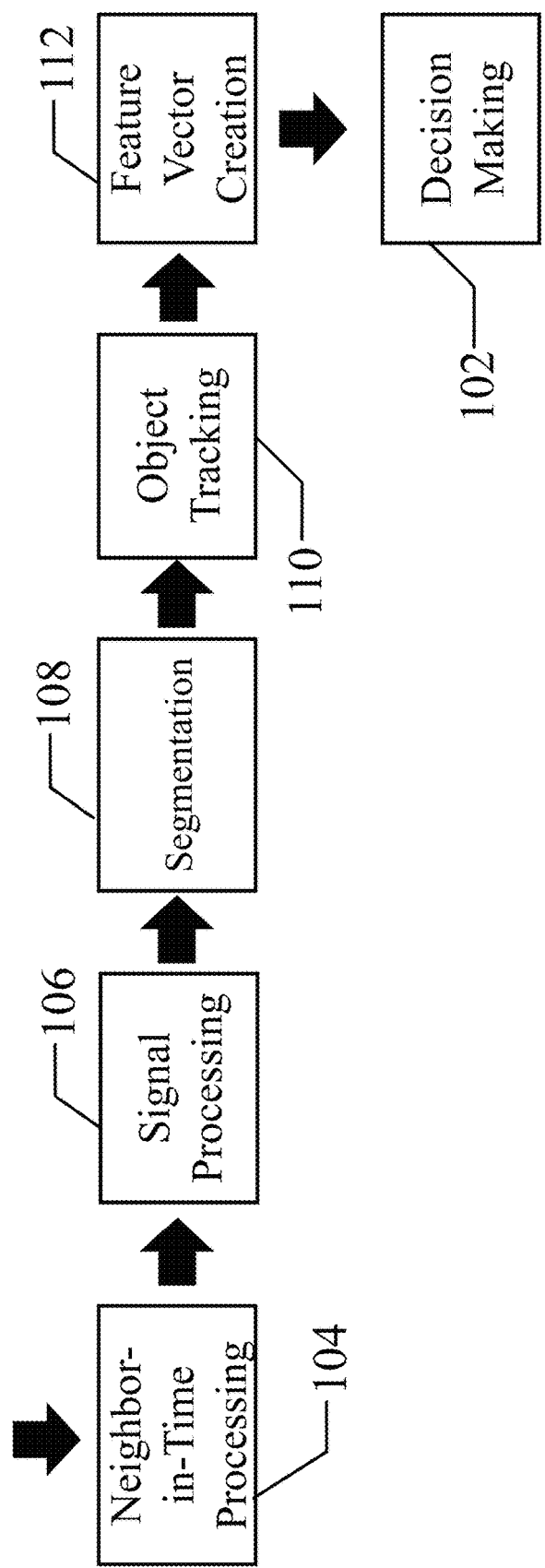
FIG. 1 illustrates vision stack modules that process sensor data to produce feature vectors.

In mission-critical applications like ADAS (Advanced Driver Assist Systems) and autonomous vehicle systems, the computer vision stack is defined as the software modules that convert raw sensor input into actionable descriptions of objects located within a sensor's field of view. FIG. 1 illustrates vision stack modules that process sensor data 100 to produce feature vectors that are used within a decision making module 102.

A neighbor-in-time processing module 104 accepts sensor information from a single-frame sensor or a multi-frame sensor. Some techniques for single-frame and multi-frame processing that are performed by neighbor-in-time processing are disclosed U.S. Pat. No. 9,866,816 (Retterath), which is hereby incorporated by reference. Neighbor-in-time processing includes, but is not limited to, HDR (High Dynamic Range) imaging, XDR (extended Dynamic Range) imaging, lighting-invariant imaging, radiance determination, and image time stamping for downstream object tracking and feature vector clustering.

A signal processing module 106 performs convolutional functions like image filtering, noise reduction, sharpening, and contrast control.

A segmentation module 108 performs mostly convolutional functions that segment objects within the image. Common segmentation algorithms are instance segmentation, semantic segmentation, and panoptic segmentation. The output of a segmentation module is a bit-level mask set that defines the separate regions of interest within an image.

An object tracking module 110 identifies common objects within successive images.

A feature vector creation module 112 produces a smaller-data-size descriptor of all objects identified by a segmentation module 108. Inputs to a feature vector creation module 112 include a pixel-level image mask and the imaged pixels that represent the object. The imaged pixels and the associated object mask may contain 10,000+ or 100,000+ pieces of information that describe an object. The conversion of the object descriptor information to a feature vector allows smaller sets of data to be passed to a decision-making module 102. Techniques for producing feature vectors in a vision stack are disclosed in PCT Appl. No. PCT/US20/24200, which is hereby incorporated by reference.

Vision stacks similar to FIG. 1 are presently executed on digital hardware that is not contained within the sensor. Because of this architectural limitation, real-time, mission-critical vision stacks that utilize neural network processing are limited because: 1) sensors must send a lot of raw image data to the processing function, 2) there is a one-to-many relationship between processors and pixels, 3) digital processors require high power consumption, and 4) digital processing architectures are data starved and spend many clock cycles waiting for data to process. In contrast to such prior art digital hardware architectures, in various embodiments of the present disclosure some, most, or all of the vision stack is executed on-sensor and in-pixel with analog processing elements and analog storage. In embodiments, analog in-pixel processing and analog in-pixel storage for sensor data realizes increases in MACs (multiply-accumulate operations) per second and MACs per Watt over such digital hardware architectures.

Convolution in image processing and neural network processing is a mathematical operation whereby a convolutional mask is applied to each pixel in an image. Typical convolutional mask sizes are 3×3, 5×5, and 7×7. The mathematical equation for a 3×3 convolutional for a pixel i,j is:

$$I_{conv}=\Sigma_{x=-1}^{1}\Sigma_{y=-1}^{1}I(i+x,j+y)*M(x,y) \quad \text{Eq. 1}$$

Where $I_{Conv}$ is the intensity result of the convolutional mask operation

I(i,j) is the intensity value of the pixel that aligns with the center pixel of the mask M(x,y) is the convolutional mask For Eq. 1 there are nine multiply-accumulate (MAC) operations performed on each image pixel. The use of larger convolutional masks will typically provide better information for vision stack functions. However, larger convolutional masks, when applied to entire images, increase the computational needs for a vision stack. Table 1 shows the number of MACs required per pixel for several convolutional mask sizes.

TABLE 1

Number of MACs per Pixel for Various Convolutional Mask Sizes

| Mask Size | MACs per Pixel |
|---|---|
| 3 × 3 | 9 |
| 5 × 5 | 25 |
| 7 × 7 | 49 |
| 9 × 9 | 81 |
| 11 × 11 | 121 |

It is the challenge of image processing and neural network processing functions within vision stacks to select convolutional mask sizes that maximize the quality of the information while minimizing the MACs.

Figure 2:
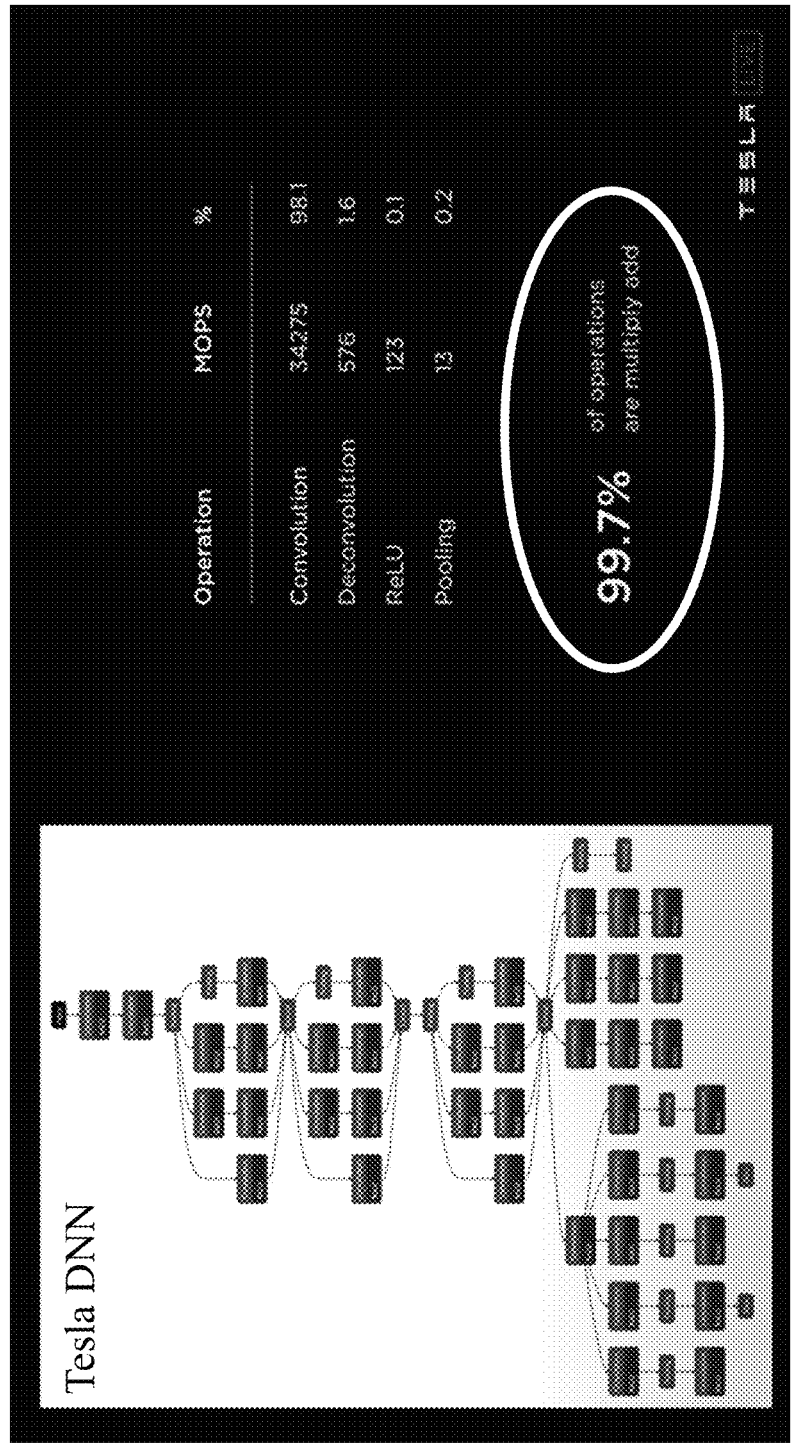
FIG. 2 illustrates prior art DNN (deep neural network) performance for an automotive application.

FIG. 2 shows information from Tesla's Autonomy Day presentation that relates to DNN (Deep Neural Network) processing. For all DNNs used in Tesla's on-board processing, 99.7% of the operations are multiply-add operations, or MACs.

Figure 3:
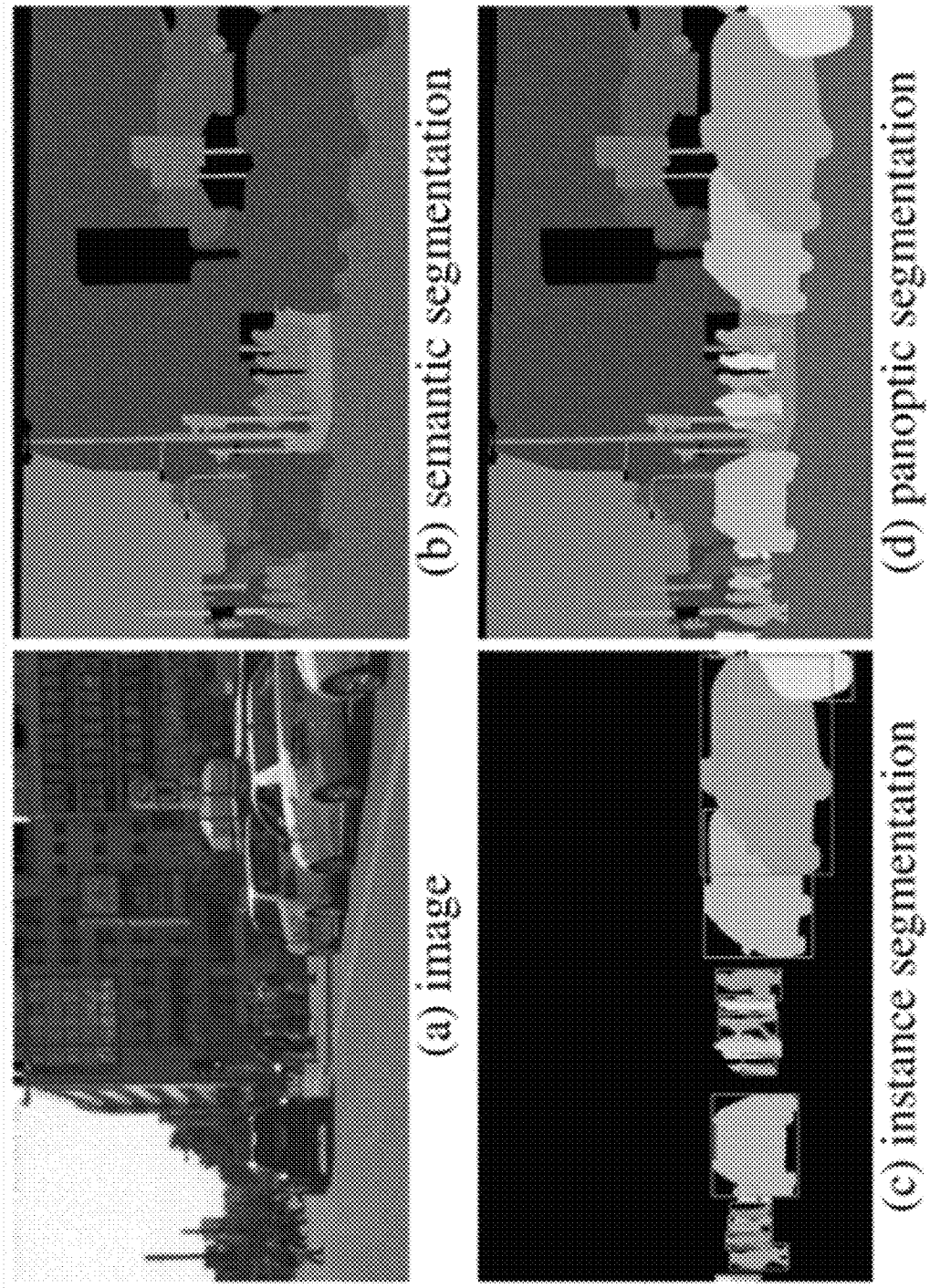
FIG. 3 illustrates an image from a sensor and the output from three prior art segmentation algorithms.

FIG. 3a illustrates an image from a sensor and the output from three segmentation algorithms—semantic segmentation output FIG. 3b, instance segmentation output FIG. 3c, and panoptic segmentation output FIG. 3d. Semantic segmentation determines per-pixel class labels, instance segmentation determines per-object mask and class labels, and panoptic segmentation determines per-pixel class and instance labels.

Because of the high percentages of MACs for image processing with neural networks, providing MAC performance metrics for various analog and digital architectures is a good indicator for overall neural network performance. Table 2 below illustrates the approximate number of MACs required for a typical DNN implementation for the signal processing, segmentation, object tracking and feature vector creation modules from FIG. 1. The number of MACs per image are for 1.3 megapixel images.

TABLE 2

Number of MACs Required for DNN Vision Stack Modules for 1.3 MP Images

| Module | MACs |
|---|---|
| Signal Processing | 100M |
| Segmentation | 400M |
| Object Tracking | 150M |
| Feature Vector Creation | 150M |

Various digital hardware architectures are used today for data center, domain controller, and edge processing. Table 3 below shows a performance analysis comparison for in-pixel analog processing in accordance with various embodiments of the present disclosure against such digital hardware architectures as a general-purpose device like a CPU, a general-purpose graphics device like a GPU, and a best-in-class NNE (neural network engine) like the Tesla FSD. In various embodiments, the NitAPP/QNN (Neighbor-in-time Analog Pixel Processing/Quantized Neural Network) exhibits favorable performance metrics in Table 3 below, which shows the throughput comparisons for four architectures and the corresponding number of images per second that can be processed.

TABLE 3

MACs/second and images/second for
four neural network processors

| Processor Type | MACs per second | 1.3 MP images per second |
| --- | --- | --- |
| CPU | 1 B | 1.25 |
| GPU | 15 B | 18.75 |
| NNE | 250 B | 312.5 |
| NitAPP/QNN | 2200 B | 2750 |

General purpose digital CPUs/GPUs and digital NNEs: 1) store information in digital form, 2) perform math operations using digital ALUs (Arithmetic Logic Units), 3) expend energy by using an instruction sequencer, and 4) expend energy to fetch information from memory and store results in memory. The number of picoJoules (pJ) per MAC for digital architectures is determined by adding up the amount of electrical current that is utilized by all of the transistors that are switched and the amount of electrical current that is conducted by all of the transistors that are required to conduct current during the performance of a MAC. For digital hardware architectures, each MAC requires the switching and/or conducting of current for thousands of transistors. In contrast in embodiments of the present disclosure, a NitAPP/QNN: 1) stores information in analog form, 2) requires no transistors to implement an analog ALU, 3) requires no transistors to perform instruction sequencing, and 4) does not require any off-pixel memory transactions. In embodiments, a MAC is performed with a NitAPP/QNN by switching as few as 10 transistors. In embodiments, the switching of as few as ten transistors, versus thousands of transistors for digital architectures, allows NitAPP/QNN to consume far less power per neural network image processed. Table 4 below illustrates the energy per MAC and the number of MACs per Watt for three digital hardware architectures versus the NitAPP/QNN in accordance with various embodiments of the present disclosure.

TABLE 4 picoJoules per MAC and MACs per Watt
for neural network image processing

| Processor Type | pJ per MAC | MACs per Watt |
| --- | --- | --- |
| CPU | 35 | 2.86 B |
| GPU | 20 | 5 B |
| NNE | 5 | 20 B |
| NitAPP/QNN | 0.13 | 769 B |

In embodiments, an in-pixel analog processor architecture in accordance with various embodiments can utilize panoptic segmentation to realize capabilities from instance and semantic segmentation that provides system-level advantages over off-sensor, digital processing hardware architectures.

Figure 4:
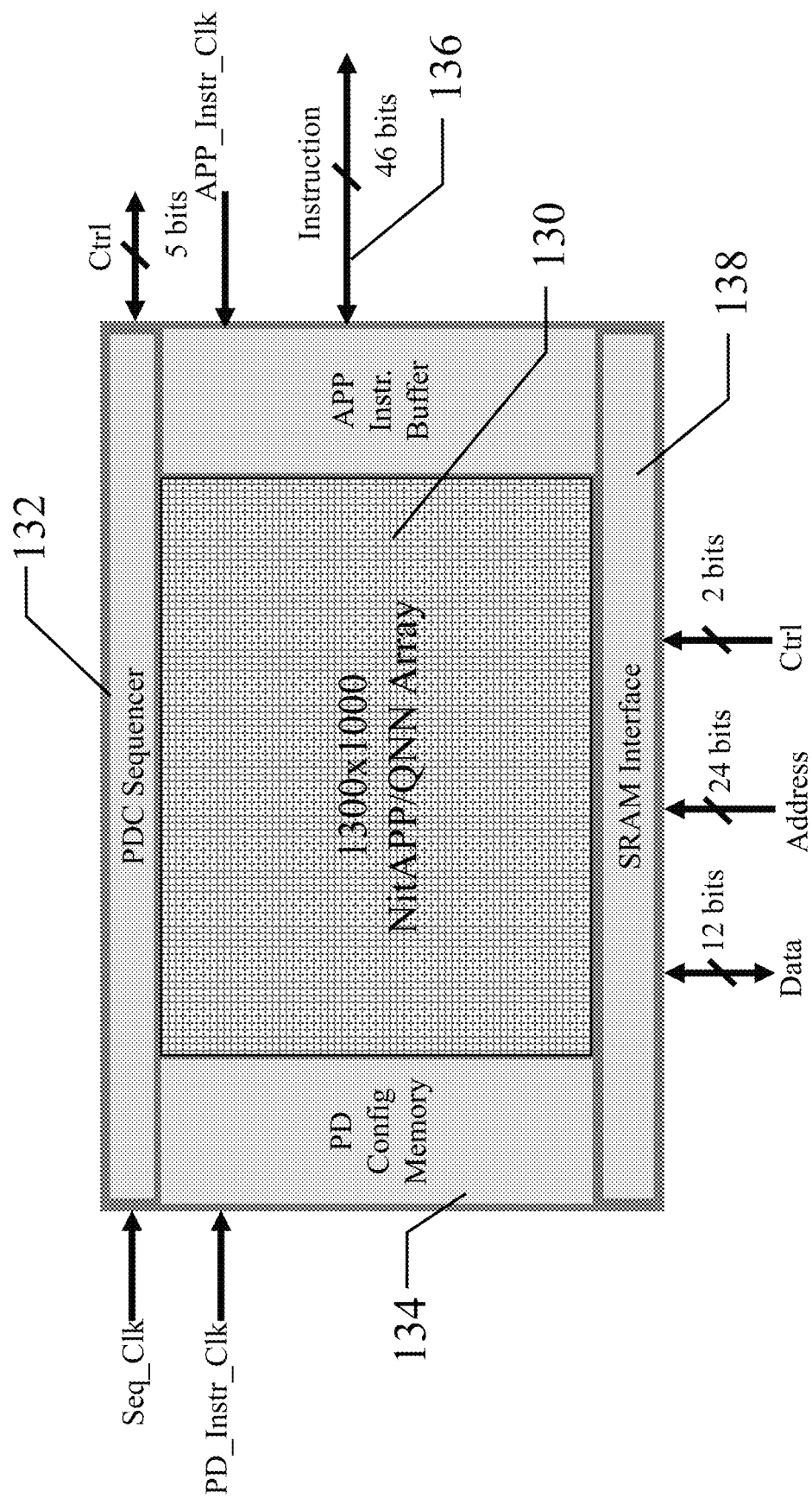
FIG. 4 illustrates a functional block diagram for an analog in-pixel computing device in accordance with an embodiment.

FIG. 4 illustrates an embodiment of a functional block diagram for a NitAPP/QNN device. At the center of the device is the NitAPP/QNN array 130 which consists of 1,300,000 sub-frame pixel elements. Sub-frame pixel elements are fabricated in a grid pattern, with each sub-frame pixel having rectangular or square boundaries. For regularly-spaced sub-frame pixels, the pitch is defined as the distance between the mid-points of adjacent photodetector elements within the grid. In embodiments, the pitch of NitAPP/QNN sub-frame pixels ranges from 1.5 µm to 40 µm. In embodiments, PD (photodetector) config memory 134 stores information that will be used for sequencing the control circuitry associated with a photodetector. The PDC (photodetector control) sequencer 132 utilizes a Seq_Clk signal to step through the PDC bit values stored in the PDC config memory. An APP (analog pixel processor) instruction bus 136 connects to all 1.3 million APP processing elements and controls the flow of information and the math and logic operations performed within each APP processing element. The APP processing exhibits a high degree of processing parallelism because all 1.3 million APP processing elements simultaneously execute the same instruction. APP instructions are executed at a rate according to the frequency supplied by the APP_Instr_Clk signal. An SRAM interface 138 block utilizes an address bus that is decoded to control the read or write operation of digital to/from a CPU, GPU or FPGA (field programmable gate array). In embodiments, NitAPP/QNN functionality is implemented on a single device utilizing a semiconductor fabrication process. In embodiments, the number of sub-frame pixels with APP processing elements that are implemented on a single device may be as low as 1024 (in a 32×32 grid pattern) and may be as high as 268,435,456 (in a 16,384×16,384 grid pattern).

Figure 5:
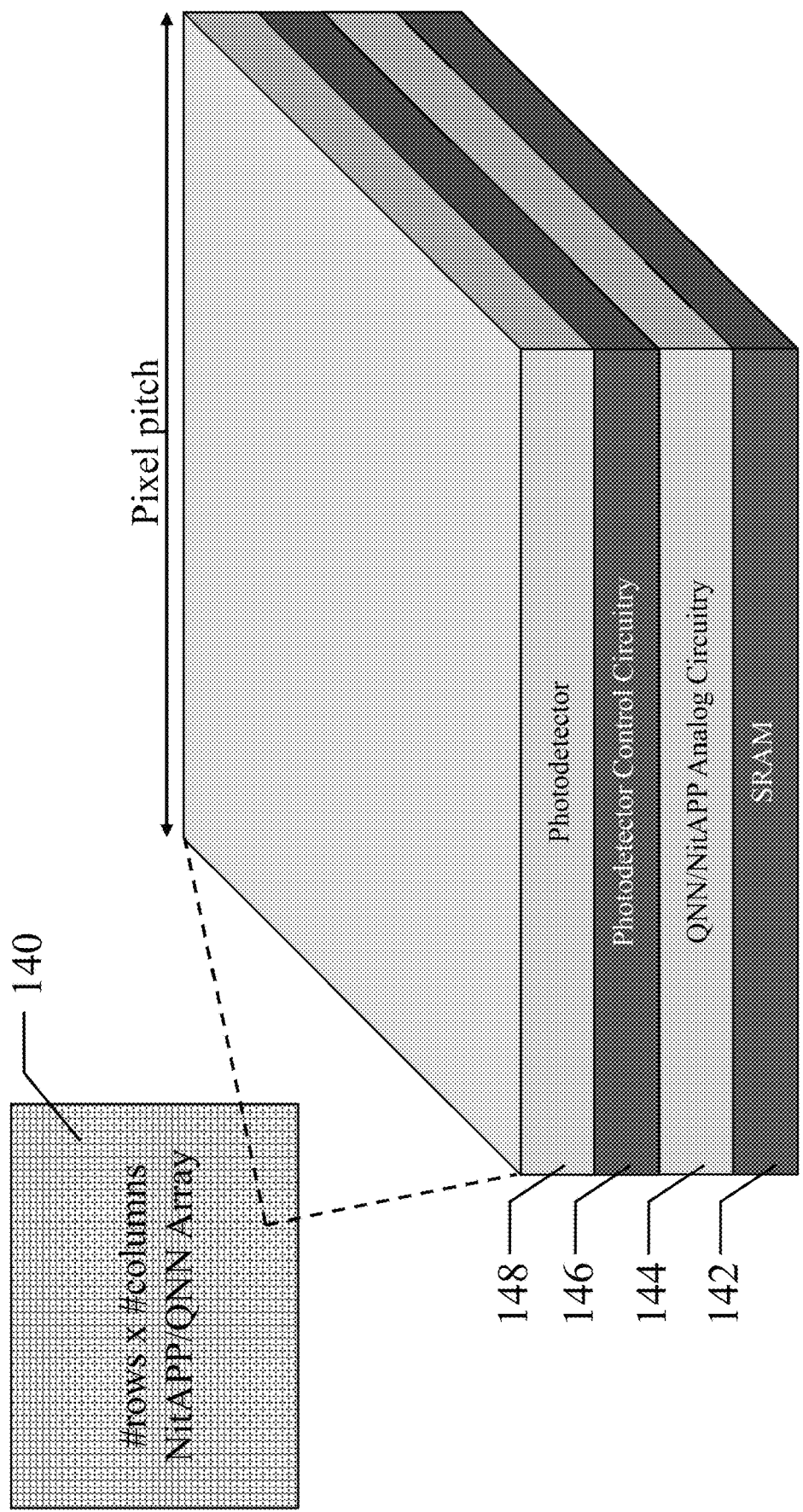
FIG. 5 illustrates a detailed view of a single sub-frame imaging pixel in accordance with a four-substrate configuration embodiment.

FIG. 5 illustrates an embodiment of a NitAPP/QNN array 140 and a detailed view of a single sub-frame imaging pixel. In embodiments, the imaging pixel utilizes a stacked-substrate configuration whereby the hardware layers of the pixel are fabricated on separate devices. Connections between layers are provide by means of metal bonding pads and/or TSVs (through-silicon vias). In embodiments, SRAM 142 forms the lowest layer of the sub-frame pixel stack. SRAM is a digital architecture that utilizes mostly digital components. In embodiments, NitAPP/QNN computing circuitry 144 forms the second layer of a hardware stack, and PDC (photodetector control) circuitry 146 forms the third layer. The top layer of the hardware stack is the photodetector 148 because it requires exposure to external fields of view.

Figure 6:
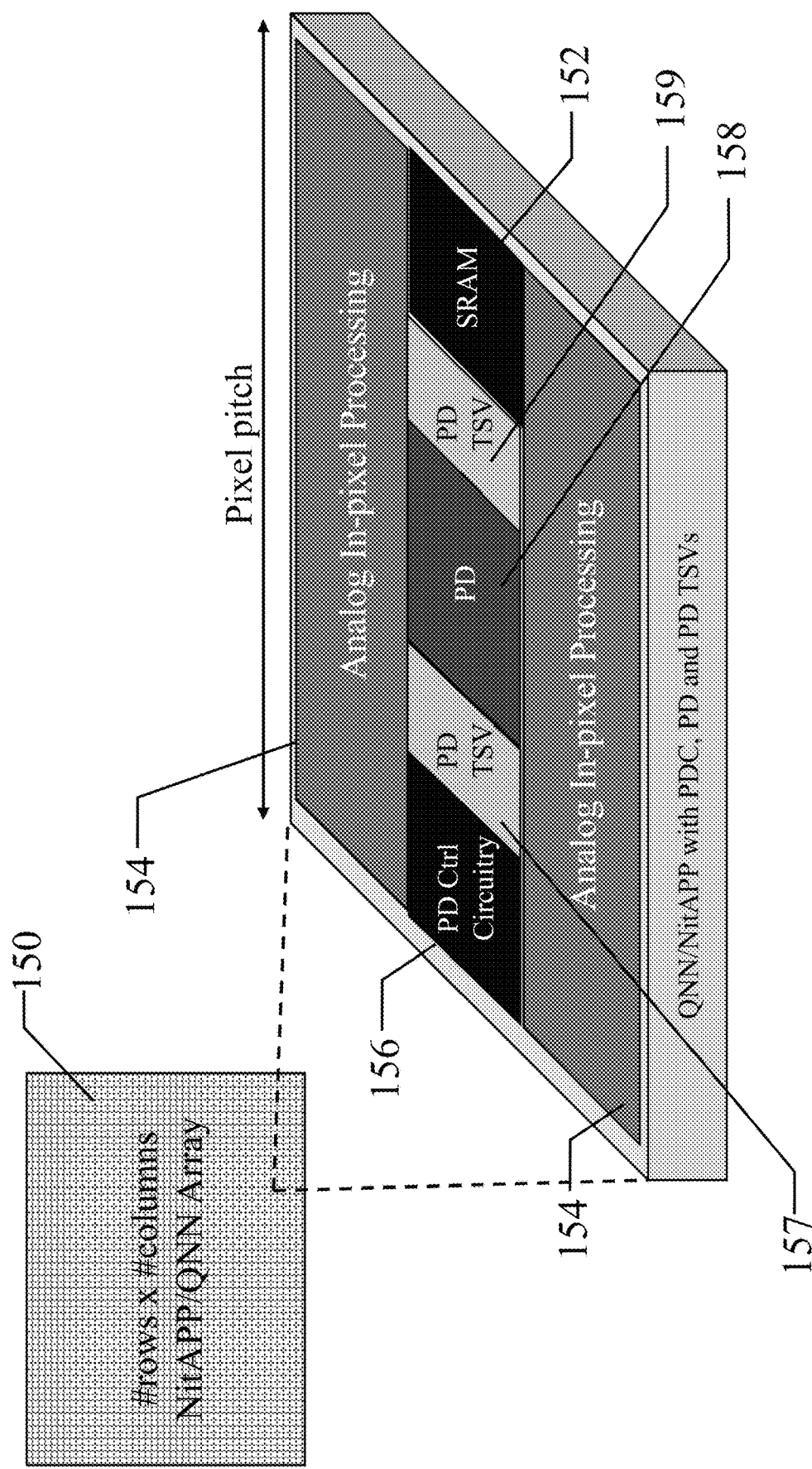
FIG. 6 illustrates a detailed view of a single sub-frame imaging pixel in accordance with a single-substrate configuration embodiment.

FIG. 6 illustrates an embodiment of a NitAPP/QNN array 150 and a detailed view of a single sub-frame imaging pixel whereby the fabricated sub-frame pixel includes a photodetector 158, PDC circuitry 156, SRAM 152, and analog in-pixel processing 154. In embodiments, the imaging pixel utilizes a single-substrate configuration whereby the analog and digital circuitry of the sub-frame pixel is fabricated on the same device. In embodiments, PD TSVs 157, 159 are connected to two terminals of the photodetector, thus enabling constructions whereby a photodetector substrate can be affixed in a stacked substrate configuration. In embodiments, the inclusion of PD TSVs 157, 159 allows a fabricated NitAPP/QNN semiconductor device to be utilized in a single-substrate or a stacked-substrate configuration.

Figure 7:
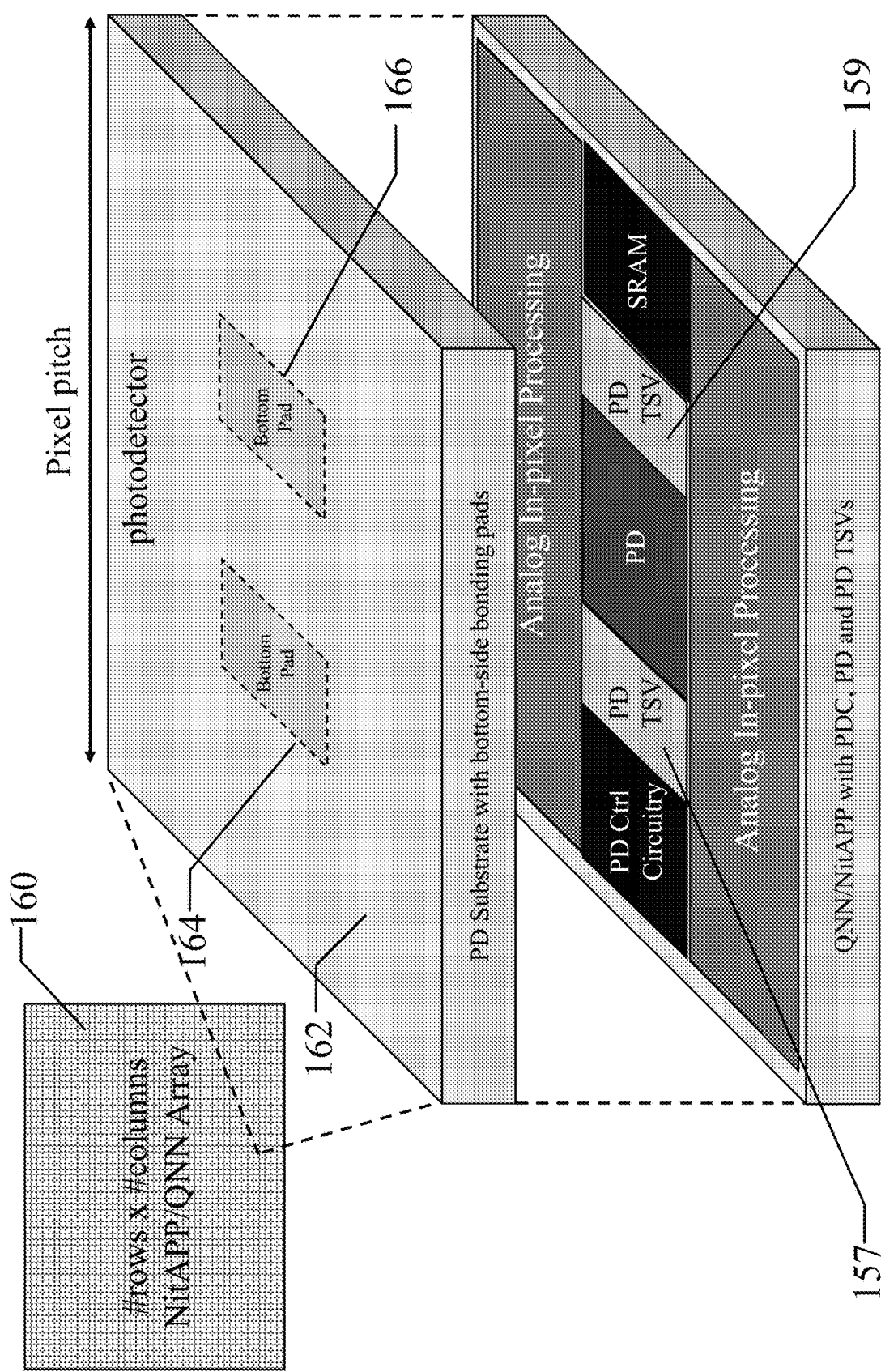
FIG. 7 illustrates a detailed view of a single sub-frame imaging pixel in accordance with a two-substrate configuration embodiment.

FIG. 7 illustrates an embodiment of a NitAPP/QNN array 160 from FIG. 6 with an upper photodetector substrate 162 affixed to the top side of the lower substrate. The upper surface of the photodetector expands to the full extent of the pixel pitch, thus allowing for increases in photodetector sensitivity. In embodiments, photodetector substrates are produced with materials that allow for sensitivity in different wavelength regions than the photodetector that is integrated into the NitAPP/QNN substrate layer. During the substrate bonding process, bottom pad 164 is electrically affixed to TSV 157 and bottom pad 166 is electrically affixed to TSV 159 for all photodetector elements and all lower-substrate elements within the NitAPP/QNN array 160.

In embodiments, photodetector control circuitry operates by utilizing a process called integration. During a photodetector integration time, current that is produced by a photodetector is gated to a storage element like a charge capacitor. The collected charge is a function of the duration of the integration and the amplitude of the photodetector current. Most digital cameras utilize the process of photodetector integration to produce intensity values for the camera's image pixels.

Event cameras contain pixels that independently respond to changes in brightness as they occur. Each pixel stores a reference brightness level, and continuously compares it to the current level of brightness. If the difference in brightness exceeds a preset threshold, that pixel resets its reference level and generates an event; a discrete packet of information containing the pixel address and timestamp Events may also contain the polarity (increase or decrease) of a brightness change, or an instantaneous measurement of the current level of illumination. Thus, event cameras output an asynchronous stream of events triggered by changes in scene illumination.

Figure 8:
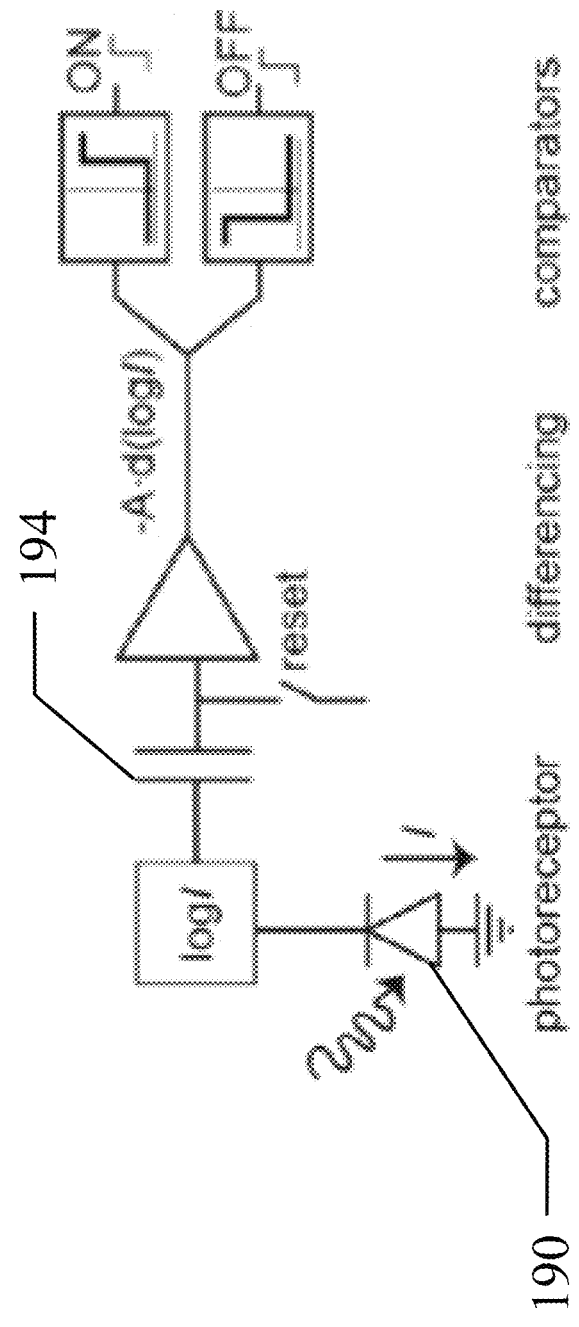
FIG. 8 illustrates functional circuitry for a pixel for use in an event camera.

FIG. 8 illustrates functional circuitry for a pixel for use in a prior art event camera. Increases in the rate of photon incidence at a photoreceptor 190 causes a Log/circuit to induce a positive charge on the capacitor 194. Conversely, decreases in the rate of photon incidence at a photoreceptor 190 causes a Log/circuit to induce a negative charge on the capacitor 194.

In embodiments, all sub-frame circuits within PDC circuitry utilize integration circuitry. In other embodiments, all sub-frame circuits within PDC circuitry utilize event circuitry. In other embodiments, sub-frame circuits within PDC circuitry utilize integration circuitry and event circuitry.

Figure 9:
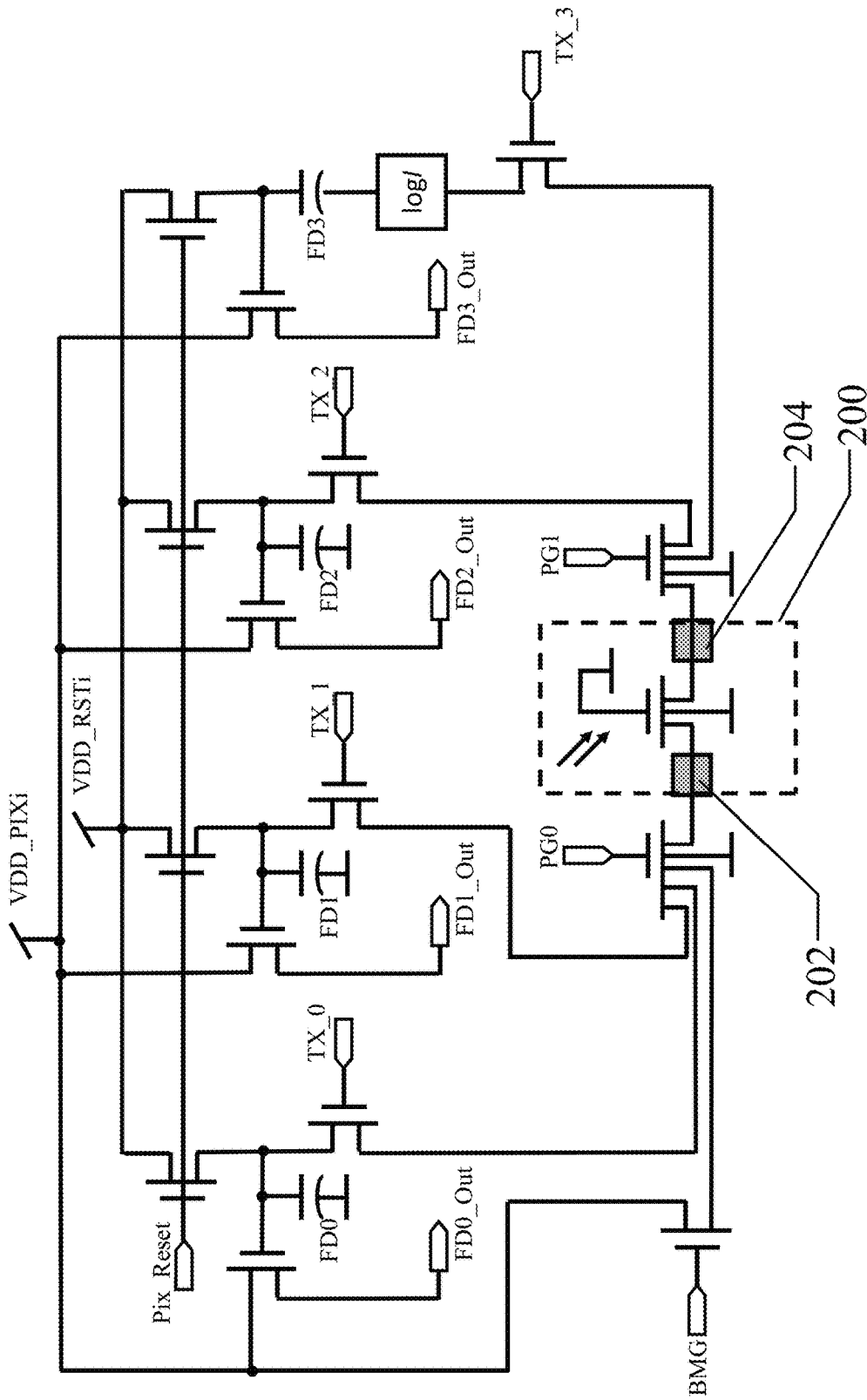
FIG. 9 illustrates an electrical schematic of a photodetector and associated photodetector control circuitry in accordance with an embodiment.

FIG. 9 illustrates an electrical schematic of an embodiment of a photodetector and associated photodetector control (PDC) circuitry. A photodetector in the form of a phototransistor accepts photons as inputs and converts them to electrical current. The photodetector is shown within a dashed box 200, indicating that the phototransistor functionality may be provided by an on-substrate photodetector or by an off-substrate photodetector. Through-silicon vias (TSVs) 202, 204 are shown that represent the locations within the PDC circuit at which the TSVs 202, 204 connect. Separation of a photodetector and the associated PDC circuitry on separate substrates allows the photodetector elements to have a different pitch than that of the PDC circuitry. In addition, utilizing separate substrates allows PDC circuitry to be fabricated using a silicon process while allowing photodetectors to be fabricated from materials like InGaAs—Indium Gallium Arsenide.

In embodiments, sub-frame information is produced as charge collection at three floating diffusion storage elements, labeled FD0, FD1 and FD2. Charge is collected at FD0 when the photodetector is conducting current and the transfer signal TX_0 is activated. Charge is collected at FD1 when the photodetector is conducting current and the transfer signal TX_1 is activated. Charge is collected at FD2 when the photodetector is conducting current and the transfer signal TX_2 is activated. FD0, FD1 and FD2 are utilized in circuitry for integration pixels. FD_3, on the other hand, is used as part of an event pixel. When TX_3 is activated the log I circuit monitors the change (direction and amplitude) in the photodetector current level. Any change, either positive (increase in current) or negative (decrease in current) is stored at FD3.

In embodiments, a four sub-frame photodetector control circuit may utilize 0, 1, 2, or 3 integration circuits and may utilize 3, 2, 1, or 0 event circuits. In embodiments, an N-sub-frame photodetector control circuit may utilize 0→N integration circuits and may utilize N→0 event circuits.

Figure 10:
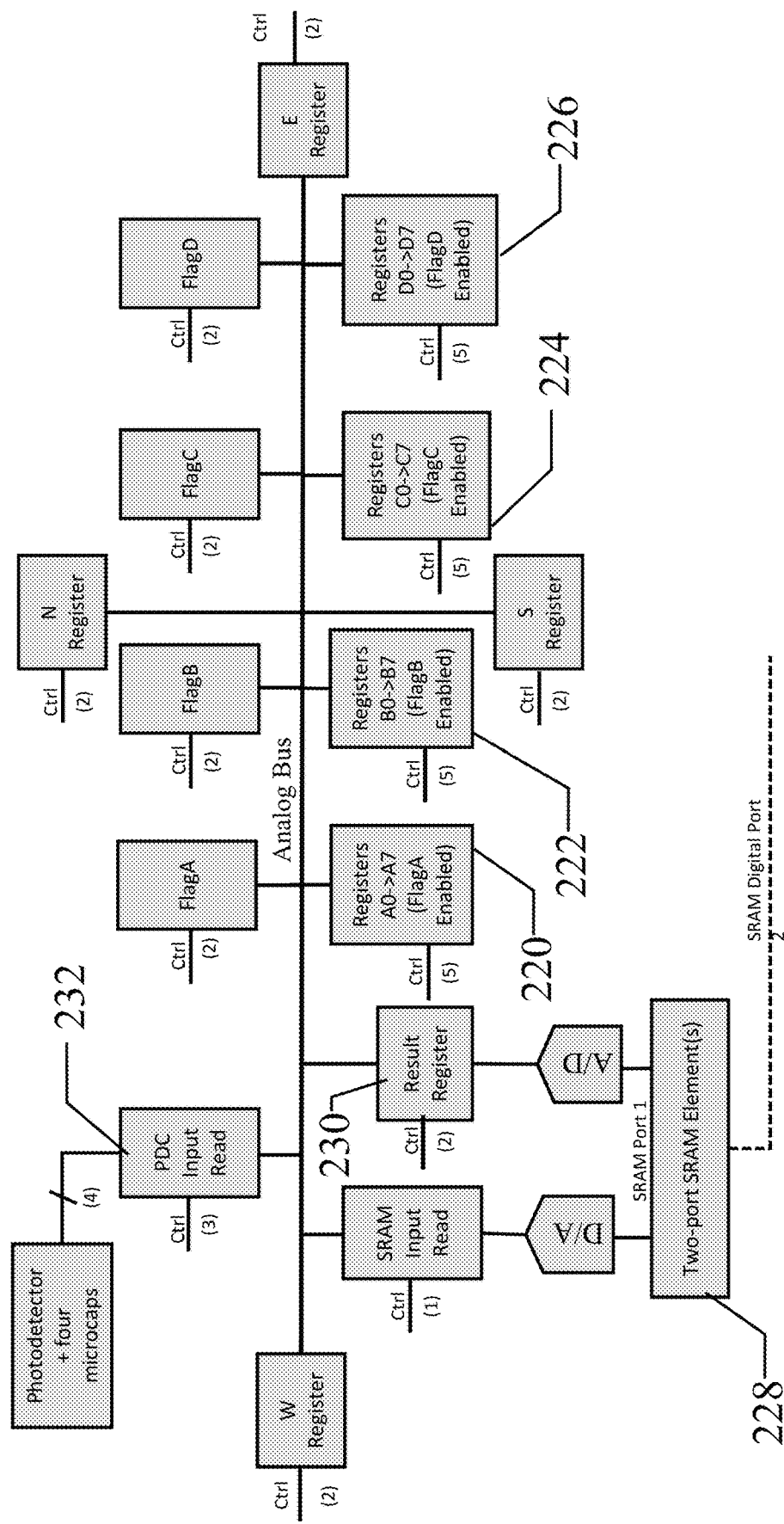
FIG. 10 illustrates a functional block diagram of embodiments of an analog sub-frame processing element in accordance with an embodiment.

A functional block diagram of embodiments of an analog sub-frame processing element for NitAPP (Neighbor-in-time Analog Pixel Processing) and neighbor-in-space computation using QNN is shown in FIG. 10. In embodiments, four register banks A0-A7 220, B0-B7 222, C0-C7 224 and D0-D7 226 containing 32 analog registers are used for the storing of analog values. In embodiments, the number of register banks per processing element is as little as two and as high as eight. In embodiments, registers within register banks 220, 222, 224, 226 are selected for read or write operations via encoded register selector bits. In embodiments, only one register within a register bank may be selected at a time for a read or write operation. In embodiments, the number of registers in a bank can be as small as two and as high as sixteen. In embodiments, write operations for register bank A 220 occur when a Wrt_Ax mnemonic is executed and the FlagA is active. In embodiments, write operations for register bank B 222 occur when a Wrt_Bx mnemonic is executed and the FlagB is active. In embodiments, write operations for register bank C 224 occur when a Wrt_Cx mnemonic is executed and the FlagC is active. In embodiments, write operations for register bank D 226 occur when a Wrt_Dx mnemonic is executed and the FlagD is active.

In embodiments, NEWS registers, which signify North East West South operations, allow processing elements to pass information to neighboring processors. The N register of a processing element is the same physical register as the S register of the pixel processor to the north. N register mnemonics are Rd_N for a read operation and Wrt_N for a write operation. The E register of a processing element is the same physical register as the W register of the pixel processor to the east. E register mnemonics are Rd_E for a read operation and Wrt_E for a write operation. The W register of a processing element is the same physical register as the E register of the pixel processor to the west. W register mnemonics are Rd_W for a read operation and Wrt_W for a write operation. The S register of a processing element is the same physical register as the N register of the pixel processor to the south. S register mnemonics are Rd_S for a read operation and Wrt_S for a write operation.

SRAM 228 is used to communicate with off-device digital processing elements. One to four SRAM 228 elements are utilized per pixel, with each consisting of from eight to sixteen bits per SRAM 228 element. CPUs, GPUs and other digital communication processors read information in digital format from, or write information in digital format to, the addressable digital memory elements via an SRAM 228 digital port. In embodiments, the digital memory connection to the digital element may be SRAM, DRAM, DDR, etc.

In embodiments, an SRAM 228 input read functional block allows a digital-to-analog (D/A) converted value to be enabled onto the analog bus. A result register 230 is used to store analog values that will be transferred to digital memory. An analog-to-digital (A/D) circuit converts an analog value contained in the result register 230 to a multi-bit digital value that is written to a selected SRAM 228 location.

In embodiments, PDC input read 232 enables an analog value from a sub-frame storage element in the PDC circuitry onto the analog bus. PDC circuitry and analog computing circuitry are controlled by separate instruction bits. In embodiments, a four sub-frame PDC circuit is controlled by as few as six instruction bits.

Table 5 below illustrates the analog pixel processing (APP) instruction bit names and descriptions for the 46-bit APP instruction bus that controls all processing elements within an array of sub-frame pixels.

TABLE 5

APP Instruction Bit Definitions
Instruction Bus Bit Definitions:

| Bit # | Name | Description |
|---|---|---|
|  | // Photodetector Cap Input | |
| 45 | PDC_Sel(1) | Bit 1 of Selector Code for Photodetector Caps |
| 44 | PDC_Sel(0) | Bit 0 of Selector Code for Photodetector Caps |
| 43 | Rd_PDC | Enable Selected Photodetector Cap to Analog Bus |
|  | // NEWS Registers | |
| 42 | Wrt_N | Write Analog Bus to Register N |
| 41 | Rd_N | Enable Register N to Analog Bus |
| 40 | Wrt_E | Write Analog Bus to Register E |
| 39 | Rd_E | Enable Register E to Analog Bus |
| 38 | Wrt_W | Write Analog Bus to Register W |
| 37 | Rd_W | Enable Register W to Analog Bus |
| 36 | Wrt_S | Write Analog Bus to Register S |
| 35 | Rd_S | Enable Register S to Analog Bus |
|  | // FlagA | |
| 34 | Wrt_FA | Set FlagA according to value on Analog Bus |
| 33 | Set_FA | Set FlagA to Active |
| 32 | Enbl_FA | Enable Analog Bus to FlagA Latch circuit |
|  | // FlagB | |
| 31 | Wrt_FB | Set FlagB according to value on Analog Bus |
| 30 | Set_FB | Set FlagB to Active |
| 29 | Enbl_FB | Enable Analog Bus to FlagB Latch circuit |
|  | // FlagC | |
| 28 | Wrt_FC | Set FlagC according to value on Analog Bus |
| 27 | Set_FC | Set FlagC to Active |
| 26 | Enbl_FC | Enable Analog Bus to FlagC Latch circuit |
|  | // FlagD | |
| 25 | Wrt_FD | Set FlagD according to value on Analog Bus |
| 24 | Set_FD | Set FlagD to Active |
| 23 | Enbl_FD | Enable Analog Bus to FlagD Latch circuit |
|  | // SRAM Port 1 | |
| 22 | Wrt_Result | Write Analog Bus to Result register |
| 21 | Rd_DAC | Enable SRAM DAC to Analog Bus |
| 20 | Wrt_ADC | Write result register to SRAM |
|  | // Register Bank A | |
| 19 | A_Sel(2) | Bit 2 of Selector Code for Register Bank A |
| 18 | A_Sel(1) | Bit 1 of Selector Code for Register Bank A |
| 17 | A_Sel(0) | Bit 0 of Selector Code for Register Bank A |
| 16 | Wrt_A | Write Analog Bus to Selected Register A |
| 15 | Rd_A | Enable Selected Register A to Analog Bus |
|  | // Register Bank B | |
| 14 | B_Sel(2) | Bit 2 of Selector Code for Register Bank B |
| 13 | B_Sel(1) | Bit 1 of Selector Code for Register Bank B |
| 12 | B_Sel(0) | Bit 0 of Selector Code for Register Bank B |
| 11 | Wrt_B | Write Analog Bus to Selected Register B |
| 10 | Rd_B | Enable Selected Register B to Analog Bus |
|  | // Register Bank C | |
| 9 | C_Sel(2) | Bit 2 of Selector Code for Register Bank C |
| 8 | C_Sel(1) | Bit 1 of Selector Code for Register Bank C |
| 7 | C_Sel(0) | Bit 0 of Selector Code for Register Bank C |
| 6 | Wrt_C | Write Analog Bus to Selected Register C |
| 5 | Rd_C | Enable Selected Register C to Analog Bus |
|  | // Register Bank D | |
| 4 | D_Sel(2) | Bit 2 of Selector Code for Register Bank D |
| 3 | D_Sel(1) | Bit 1 of Selector Code for Register Bank D |
| 2 | D_Sel(0) | Bit 0 of Selector Code for Register Bank D |
| 1 | Wrt_D | Write Analog Bus to Selected Register D |
| 0 | Rd_D | Enable Selected Register D to Analog Bus |

Figure 11:
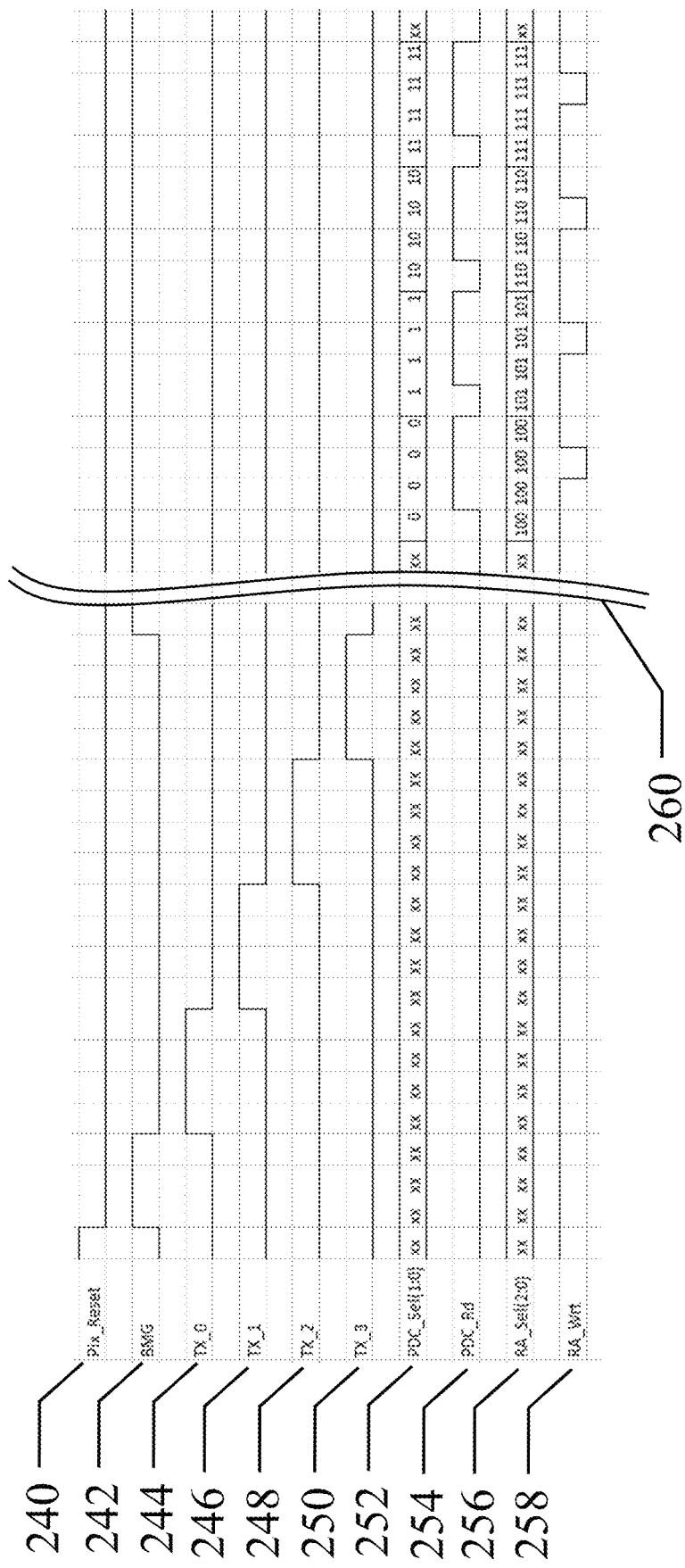
FIG. 11 illustrates a timing sequence for capturing analog information in photodetector control circuitry and transfer of analog information into analog pixel processing circuitry in accordance with an embodiment.

In embodiments, the functionality provided by PDC (photodetector control) circuitry is controlled through PDC instruction bits and the functionality provided by APP (analog pixel processing) circuitry is controlled through APP instruction bits. FIG. 11 illustrates a timing sequence for capturing analog information in PDC circuitry and the subsequent transfer of analog information into registers within APP circuitry. A Pix_Reset 240 signal, when activated, removes all charge from the PDC storage elements. A BMG (anti-blooming gate) 242 signal allows current to flow freely from the photodetector without collecting charge at the photodetector. During the time TX_0 244 is active, current that flows from the photodetector is stored as charge at FD0. During the time TX_1 246 is active, current that flows from the photodetector is stored as charge at FD1. During the time TX_2 248 is active, current that flows from the photodetector is stored as charge at FD2. During the time TX_3 250 is active, current that flows from the log/circuitry is stored as charge at FD3. In embodiments, the control signals Pix_Reset 240, BMG 242, TX_0 244, TX_1 246, TX_2 248 and TX_3 250 are digital control signals from the PDC instruction bus and are considered PDC instruction bits.

PDC_Sel(1:0) 252 are bits from the APP instruction bus and select which analog memory element from PDC circuitry, FD0, FD1, FD2 or FD3, is enabled onto the analog bus. The PDC_Rd 254 signal determines the time during which the selected FD value from the PDC circuitry is enabled onto the analog bus. In accordance with FIG. 11, FD0 is written to register A4, FD1 is written to register A5, FD2 is written to register A6, and FD3 is written to register A7. The RA_Sel(2:0) 256 bits are from the APP instruction bus and select the register within register bank A that is written, and the RA_Wrt 258 signal determines when the selected PDC value is written to the selected APP register. A sequence divider 260 indicates that the timing of the ADC and APP sequences are not coupled together. The delay between the completion of a PDC sequence and the start of an APP sequence involving PDC elements may be zero, may be positive, or may be negative, indicating that there exists overlap between PDC processing and APP processing. In embodiments, having separate PDC and APP instruction busses allows for overlapped processing of the two functional blocks.

Figure 12:
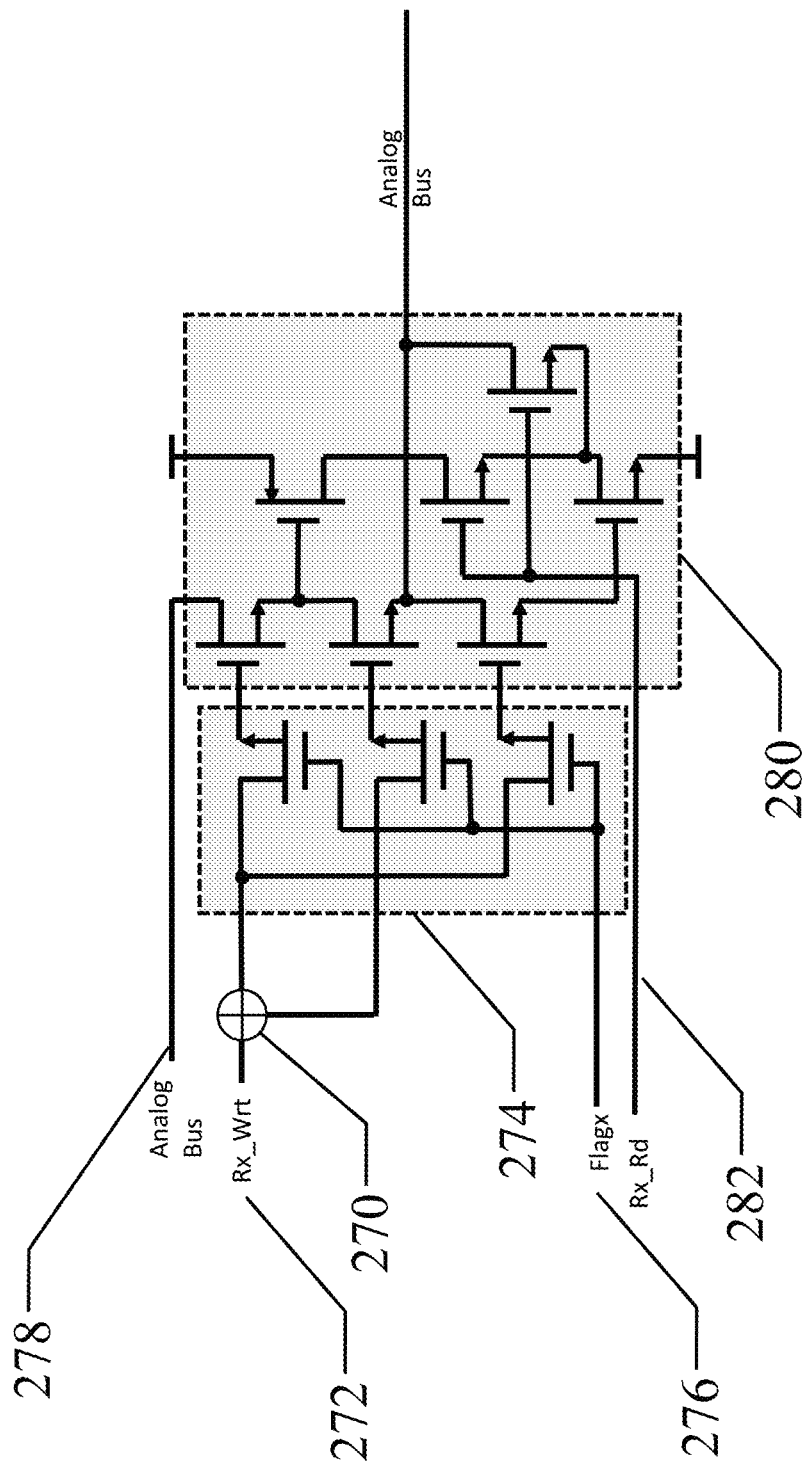
FIG. 12 illustrates an $S^2I$ description of an embodiment of analog register circuitry.

In embodiments, switched current (SI) circuitry is used to convey basic functionality. In practice, more complex circuitry is used in order to reduce processing errors, to increase accuracy, and to reduce power dissipation. FIG. 12 illustrates an $S^2I$ (current-sampling switched current) description of register circuitry. In embodiments, an expanded view of an analog register is shown that illustrates all transistor components that comprise an analog register. A write operation is performed in two phases, with a three-transistor phase generator 270 provided to split a Rx_Wrt 272 digital APP instruction signal into two phases for a write operation. An input transistor block 274 shows two phase 0 transistors and one phase 1 transistor that are enabled by a high level on a Flagx 276 signal supplied to a gate of each transistor. An active Rx_Wrt 272 signal with an active Flagx 276 signal allows an analog value on the analog bus 278 to be written to a storage portion 280 of an analog register. An active high level on digital APP instruction bit Rx_Rd 282 enables a stored register value onto the analog bus 278.

$S^2I$ registers have the ability to store positive and negative current values. The design of $S^2I$ registers yields a built-in negation of current levels. In embodiments, if a sourcing element sources a positive current to an analog bus, any register that writes the analog value must sink that same amount of current. Therefore, a positive current value on an analog bus is stored into a receiving register as a negative current value. In embodiments, because of this built-in negation, micro-code instructions generated for eventual reduction to APP instructions are written in the form (-Ax) →Bx. The microcode instruction directs the APP element to move the negated contents of Ax to Bx.

In order to translate software algorithms that are created by humans in human-readable form into operations that are performed by APP circuitry, it is important to understand the relationship between micro-code, mnemonics, and APP instruction bits. Micro-code is a software construct whereby logic and math operations are expressed in human-readable form. In embodiments, some examples of APP micro-code instructions are shown in Table 6 below.

TABLE 6

APP Micro-code instruction examples

| Micro-code | Description |
| --- | --- |
| (-A2)->B3 | Move the negative value of the contents of register A2 to register B3 |
| (-A3)/2->B6 | Divide the negative value of the contents of register A3 by 2 and store the result in register B6 |
| (-A4) + (-C5)->D0 | Add the negative contents of A4 to the negative contents of C5 and store the result in D0 |

Mnemonics describe functions that are executed with APP circuitry during the execution of an APP instruction. In embodiments, mnemonics include descriptors to write values to or read values from select registers. In embodiments, an APP with four register banks of eight registers each that includes NEWS registers, PDC circuitry and an SRAM interface will include the mnemonics shown in Table 7 below.

TABLE 7

Mnemonics for APP functionality in embodiments

| Mnemonic | Description |
| --- | --- |
| Rd_A0 | Enable register A0 to analog bus |
| Rd_A1 | Enable register A1 to analog bus |
| Rd_A2 | Enable register A2 to analog bus |
| Rd_A3 | Enable register A3 to analog bus |
| Rd_A4 | Enable register A4 to analog bus |
| Rd_A5 | Enable register A5 to analog bus |
| Rd_A6 | Enable register A6 to analog bus |
| Rd_A7 | Enable register A7 to analog bus |
| Wrt_A0 | Write analog bus current value to A0 |
| Wrt_A1 | Write analog bus current value to A1 |
| Wrt_A2 | Write analog bus current value to A2 |
| Wrt_A3 | Write analog bus current value to A3 |
| Wrt_A4 | Write analog bus current value to A4 |
| Wrt_A5 | Write analog bus current value to A5 |
| Wrt_A6 | Write analog bus current value to A6 |
| Wrt_A7 | Write analog bus current value to A7 |
| Rd_B0 | Enable register B0 to analog bus |
| Rd_B1 | Enable register B1 to analog bus |
| Rd_B2 | Enable register B2 to analog bus |
| Rd_B3 | Enable register B3 to analog bus |
| Rd_B4 | Enable register B4 to analog bus |
| Rd_B5 | Enable register B5 to analog bus |
| Rd_B6 | Enable register B6 to analog bus |
| Rd_B7 | Enable register B7 to analog bus |
| Wrt_B0 | Write analog bus current value to B0 |
| Wrt_B1 | Write analog bus current value to B1 |
| Wrt_B2 | Write analog bus current value to B2 |
| Wrt_B3 | Write analog bus current value to B3 |
| Wrt_B4 | Write analog bus current value to B4 |
| Wrt_B5 | Write analog bus current value to B5 |
| Wrt_B6 | Write analog bus current value to B6 |
| Wrt_B7 | Write analog bus current value to B7 |

TABLE 7-continued

Mnemonics for APP functionality in embodiments

| Mnemonic | Description |
| --- | --- |
| Rd_C0 | Enable register C0 to analog bus |
| Rd_C1 | Enable register C1 to analog bus |
| Rd_C2 | Enable register C2 to analog bus |
| Rd_C3 | Enable register C3 to analog bus |
| Rd_C4 | Enable register C4 to analog bus |
| Rd_C5 | Enable register C5 to analog bus |
| Rd_C6 | Enable register C6 to analog bus |
| Rd_C7 | Enable register C7 to analog bus |
| Wrt_C0 | Write analog bus current value to C0 |
| Wrt_C1 | Write analog bus current value to C1 |
| Wrt_C2 | Write analog bus current value to C2 |
| Wrt_C3 | Write analog bus current value to C3 |
| Wrt_C4 | Write analog bus current value to C4 |
| Wrt_C5 | Write analog bus current value to C5 |
| Wrt_C6 | Write analog bus current value to C6 |
| Wrt_C7 | Write analog bus current value to C7 |
| Rd_D0 | Enable register D0 to analog bus |
| Rd_D1 | Enable register D1 to analog bus |
| Rd_D2 | Enable register D2 to analog bus |
| Rd_D3 | Enable register D3 to analog bus |
| Rd_D4 | Enable register D4 to analog bus |
| Rd_D5 | Enable register D5 to analog bus |
| Rd_D6 | Enable register D6 to analog bus |
| Rd_D7 | Enable register D7 to analog bus |
| Wrt_D0 | Write analog bus current value to D0 |
| Wrt_D1 | Write analog bus current value to D1 |
| Wrt_D2 | Write analog bus current value to D2 |
| Wrt_D3 | Write analog bus current value to D3 |
| Wrt_D4 | Write analog bus current value to D4 |
| Wrt_D5 | Write analog bus current value to D5 |
| Wrt_D6 | Write analog bus current value to D6 |
| Wrt_D7 | Write analog bus current value to D7 |
| Rd_N | Enable register N to analog bus |
| Rd_E | Enable register E to analog bus |
| Rd_W | Enable register W to analog bus |
| Rd_S | Enable register S to analog bus |
| Wrt_N | Write analog bus current value to N |
| Wrt_E | Write analog bus current value to E |
| Wrt_W | Write analog bus current value to W |
| Wrt_S | Write analog bus current value to S |
| Set_FA | Set FlagA |
| Enbl_FA | FlagA enabled according to analog bus value |
| Set_FB | Set FlagB |
| Enbl_FB | FlagB enabled according to analog bus value |
| Set_FC | Set FlagC |
| Enbl_FC | FlagC enabled according to analog bus value |
| Set_FD | Set FlagD |
| Enbl_FD | FlagD enabled according to analog bus value |
| Rd_PDC0 | Enable FD0 to analog bus |
| Rd_PDC1 | Enable FD1 to analog bus |
| Rd_PDC2 | Enable FD2 to analog bus |
| Rd_PDC3 | Enable FD3 to analog bus |
| Wrt_Result | Write analog bus to result register |
| Wrt_ADC | Write Result register to SRAM |

Figure 13:
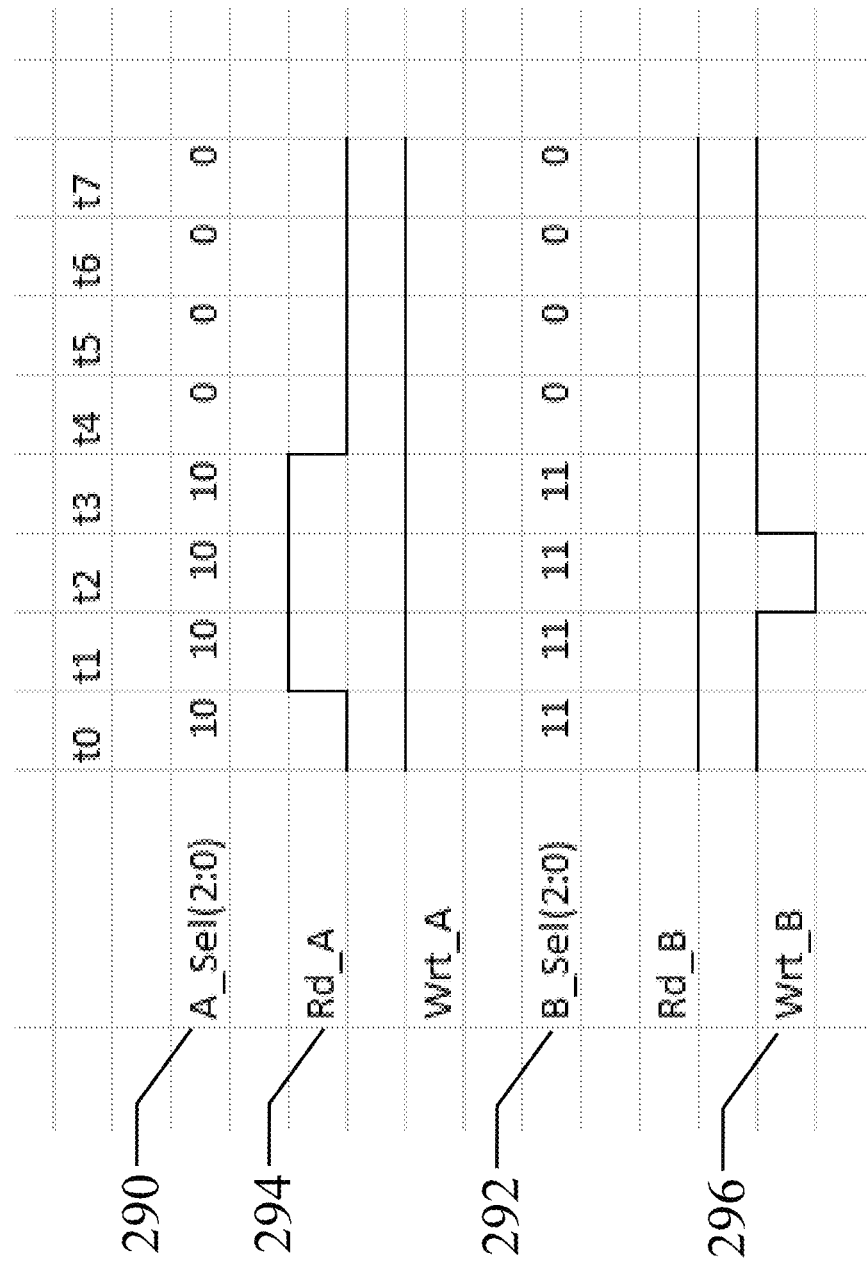
FIG. 13 illustrates a transfer operation between register banks within analog pixel processing circuitry in accordance with an embodiment.

Register transfer, logic and math operations are performed by way of enabling selected analog values to an APP analog bus while selectively writing a resulting analog bus value to registers or other storage elements. FIG. 13 illustrates a transfer operation that utilizes register bank A and register bank B. In embodiments, the transfer of information occurs during four time periods $t_0$ through $t_3$. During an entire transfer cycle, APP instruction bits A-Sel(2:0) 290 select register 2 from register bank A and APP instruction bits B_Sel(2:0) 292 select register 3 from register bank B. Analog data from register A2 is enabled during time periods $t_1$, $t_2$ and $t_3$ by energizing the Rd_A 294 APP instruction bit. Analog data is written to register B2 during time period $t_2$ by energizing the Wrt_B 296 APP instruction bit.

Figure 14:
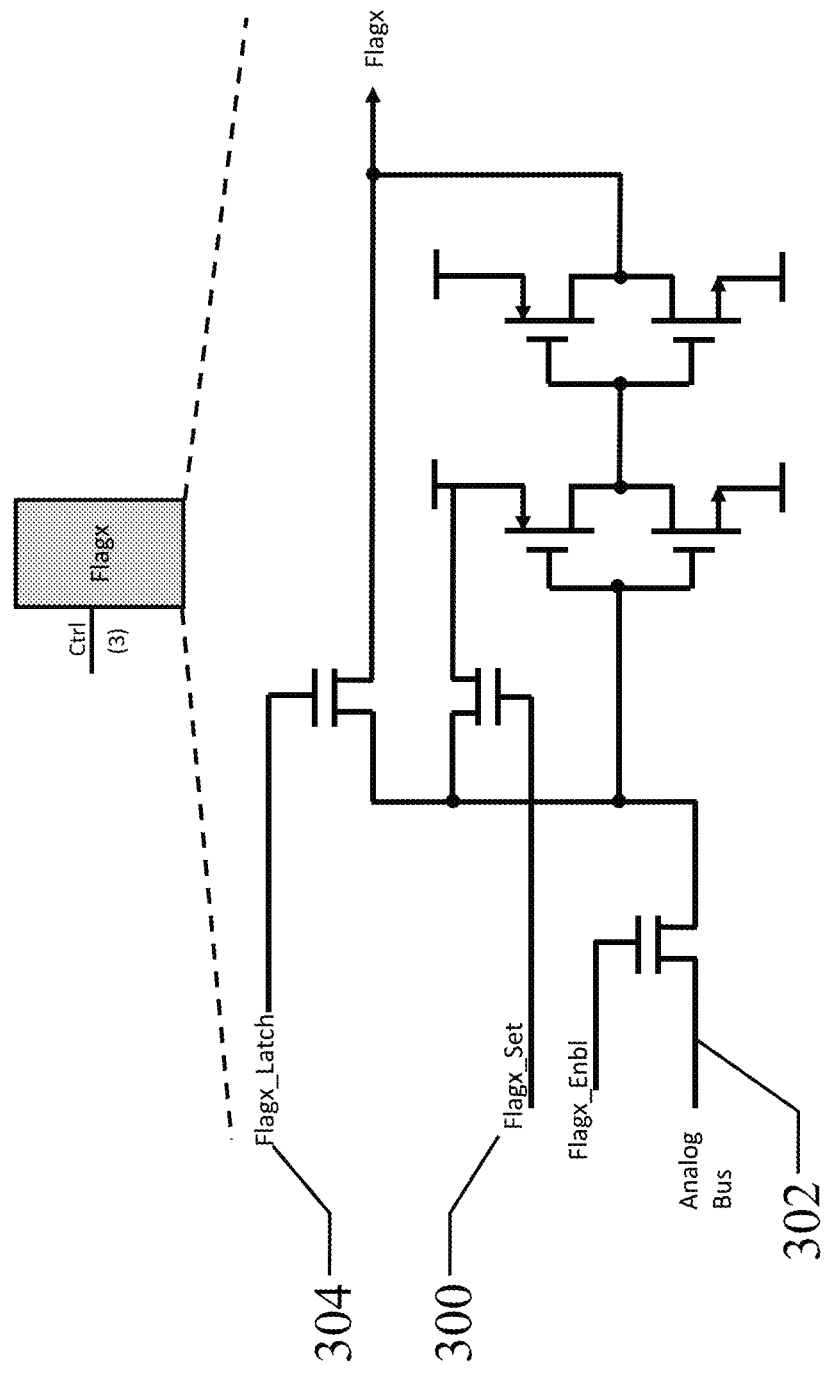
FIG. 14 illustrates a compare-and-flag functional block within analog pixel processing circuitry in accordance with an embodiment.

FIG. 14 illustrates an embodiment of a compare-and-flag functional block and a SI description of compare and flag circuitry. In embodiments, a Flagx register is implemented as a D-latch. A Flagx register can be set globally by activating a Flagx_Set 300 signal. In embodiments, during a comparison instruction a Flagx value is charged toward VDD or discharged toward ground, depending on the sign of the current from the analog bus 302. A Flagx value is stored in the register by activating a Flagx_Latch 304 signal.

A Robinson compass mask is a convolution-based algorithm used for edge detection in imagery. It has eight major compass orientations, each will extract edges in respect to its direction. A combined use of compass masks of different directions detects edges oriented at different angles. A Robinson compass mask is defined by taking a single mask and rotating it to form eight orientations. As part of the algorithm, pixel-level computations are performed by applying 3×3 convolutional masks from Table 7.1 below for each image pixel in an image.

TABLE 7

Eight directional masks for Robinson compass mask edge detection

| North: | Northwest: | West: | Southwest: |
| --- | --- | --- | --- |
| $\begin{bmatrix} -1 & 0 & 1 \\ -2 & 0 & 2 \\ -1 & 0 & 1 \end{bmatrix}$ | $\begin{bmatrix} 0 & 1 & 2 \\ -1 & 0 & 1 \\ -2 & -1 & 0 \end{bmatrix}$ | $\begin{bmatrix} 1 & 2 & 1 \\ 0 & 0 & 0 \\ -1 & -2 & -1 \end{bmatrix}$ | $\begin{bmatrix} 2 & 1 & 0 \\ 1 & 0 & -1 \\ 0 & -1 & -2 \end{bmatrix}$ |

| South: | Southeast: | East: | Northeast: |
| --- | --- | --- | --- |
| $\begin{bmatrix} 1 & 0 & -1 \\ 2 & 0 & -2 \\ 1 & 0 & -1 \end{bmatrix}$ | $\begin{bmatrix} 0 & -1 & -2 \\ 1 & 0 & -1 \\ 2 & 1 & 0 \end{bmatrix}$ | $\begin{bmatrix} -1 & -2 & -1 \\ 0 & 0 & 0 \\ 1 & 2 & 1 \end{bmatrix}$ | $\begin{bmatrix} -2 & -1 & 0 \\ -1 & 0 & 1 \\ 0 & 1 & 2 \end{bmatrix}$ |

One of the advantages of using a Robinson compass mask for edge detection is that only four of the masks need to be computed, because the results of the four non-computed masks can be obtained by negating the results of the computed masks. The final value of a pixel-level algorithm is a mask computation that yields the highest absolute value.

Table 8 below illustrates microcode instructions and associated NitAPP/QNN mnemonics for a Robinson compass mask algorithm.

TABLE 8

Microcode and Mnemonics - Robinson compass mask on NitAPP/QNN

| Microcode Instructions | | NitAPP/QNN Mnemonics | |
|---|---|---|---|
| // Robinson compass mask for edge detection with a NitAPP/QNN simulator | | | |
| // | | | |
| // initialize by setting all conditional flags | | | |
| // | | | |
| ENDIF_A | / set Flag A | Set_FA | |
| ENDIF_B | / set Flag B | Set_FB | |
| ENDIF_C | / set Flag C | Set_FC | |
| ENDIF_D | / set Flag D | Set_FD | |
| // | | | |
| // Read pixel value (from SRAM) into D0 | | | |
| // | | | |
| (−DAC)−>D1 | / read SRAM value | Rd_DAC | Wrt_D1 |
| (−D1)−>D0 | / and store it in D0 | Rd_D1 | Wrt_D0 |
| // | | | |
| // Retrieve values from NEWS and diagonal neighbors and store them in the C register block | | | |
| // | | | |
| // | | | |
| // Retrieve the NW pixel value and store it in C0 | | | |
| // | | | |
| (−D0)−>E | | Rd_D0 | Wrt_E |
| (−W)−>D1 | | Rd_W | Wrt_D1 |
| (−D1)−>S | | Rd_D1 | Wrt_S |
| (−N)−>C0 | | Rd_N | Wrt_C0 |
| // | | | |
| // Retrieve the N pixel value and store it in C1 | | | |
| // | | | |
| (−D0)−>S | | Rd_D0 | Wrt_S |
| (−N)−>C1 | | Rd_N | Wrt_C1 |
| // | | | |
| // Retrieve the NE pixel value and store it in C2 | | | |
| // | | | |
| (−D0)−>W | | Rd_D0 | Wrt_W |
| (−E)−>D1 | | Rd_E | Wrt_D1 |
| (−D1)−>S | | Rd_D1 | Wrt_S |
| (−N)−>C2 | | Rd_N | Wrt_C2 |
| // | | | |
| // Retrieve the E pixel value and store it in C3 | | | |
| // | | | |
| (−D0)−>W | | Rd_D0 | Wrt_W |
| (−E)−>C3 | | Rd_E | Wrt_C3 |
| // | | | |
| // Retrieve the SE pixel value and store it in C4 | | | |
| // | | | |
| (−D0)−>W | | Rd_D0 | Wrt_W |
| (−E)−>D1 | | Rd_E | Wrt_D1 |
| (−D1)−>N | | Rd_D1 | Wrt_N |
| (−S)−>C4 | | Rd_S | Wrt_C4 |
| // | | | |
| // Retrieve the S pixel value and store it in C5 | | | |
| // | | | |
| (−D0)−>N | | Rd_D0 | Wrt_N |
| (−S)−>C5 | | Rd_S | Wrt_C5 |
| / | | | |
| / Retrieve the SW pixel value and store it in C6 | | | |
| / | | | |
| (−D0)−>E | | Rd_D0 | Wrt_E |
| (−W)−>D1 | | Rd_W | Wrt_D1 |
| (−D1)−>N | | Rd_D1 | Wrt_N |
| (−S)−>C6 | | Rd_S | Wrt_C6 |
| // | | | |
| // Retrieve the W pixel value and store it in C7 | | | |
| // | | | |
| (−D0)−>E | | Rd_D0 | Wrt_E |
| (−W)−>C7 | | Rd_W | Wrt_C7 |
| // | | | |

TABLE 8-continued

Microcode and Mnemonics - Robinson compass mask on NitAPP/QNN

```
// North West Mask Computation
// B7 = 0*C0 + 1*C1 + 2*C2 + 1*C3 + 0*C4 + (-1)*C5 + (-2)*C6 + (-1)*C7 + 0*D0
//
    (-C5)->B2                                      Rd_C5    Wrt_B2
    (-(B2+C1))->A2    // A2 = C5-C1                Rd_B2    Rd_C1    Wrt_A2
                      //
    (-C2)->B3                                      Rd_C2    Wrt_B3
    (-C2)->D1                                      Rd_C2    Wrt_D1
    (-(B3+D1))->A3    // A3 = 2*C2                 Rd_B3    Rd_D1    Wrt_A3
                      //
    (-C6)->B3                                      Rd_C6    Wrt_B3
    (-C6)->D1                                      Rd_C6    Wrt_D1
    (-(B3+D1))->A4    // A4 = 2*C6                 Rd_B3    Rd_D1    Wrt_A4
                      //
    (-C3)->B2                                      Rd_C3    Wrt_B2
    (-(B2+C7))->A5    // A5 = C3-C7                Rd_B2    Rd_C7    Wrt_A5
                      //
    (-A3)->B3                                      Rd_A3    Wrt_B3
    (-(A4+B3))->D1    // D1 = 2*C2 + (-2)*C6       Rd_A4    Rd_B3    Wrt_D1
                      //
    (-A2)->B3                                      Rd_A2    Wrt_B3
    (-(A5+B3))->D2    // D2 = -C1 - C3 + C5 + C7   Rd_A5    Rd_B3    Wrt_D2
                      //
    (-D1)->A2                                      Rd_D1    Wrt_A2
    (-(A2+D2))->B7    // B7 = C1 + 2C2 + C3 - C5 - 2C6 - C7  Rd_A2  Rd_D2  Wrt_B7
                      //
//
// North Mask
Computation
// B6 = (-1)*C0 + 0*C1 + 1*C2 + 2*C3 + 1*C4 + 0*C5 + (-1)*C6 + (-2)*C7 + 0*D0
//
    (-C6)->B2                                      Rd_C6    Wrt_B2
    (-(B2+C2))->A2    // A2 = C6-C2                Rd_B2    Rd_C2    Wrt_A2
                      //
    (-C3)->B3                                      Rd_C3    Wrt_B3
    (-C3)->D1                                      Rd_C3    Wrt_D1
    (-(B3+D1))->A3    // A3 = 2*C3                 Rd_B3    Rd_D1    Wrt_A3
                      //
    (-C7)->B3                                      Rd_C7    Wrt_B3
    (-C7)->D1                                      Rd_C7    Wrt_D1
    (-(B3+D1))->A4    // A4 = 2*0,7                Rd_B3    Rd_D1    Wrt_A4
                      //
    (-C4)->B2                                      Rd_C4    Wrt_B2
    (-(B2+C0))->A5    // A5 = C4-C0                Rd_B2    Rd_C0    Wrt_A5
                      //
    (-A3)->B3                                      Rd_A3    Wrt_B3
    (-(A4+B3))->D1    // D1 = 2*C3 + (-2)*C7       Rd_A4    Rd_B3    Wrt_D1
                      //
    (-A2)->B3                                      Rd_A2    Wrt_B3
    (-(A5+B3))->D2    // D2 = -C2 - C4 + C6 + C0   Rd_A5    Rd_B3    Wrt_D2
                      //
    (-D1)->A2                                      Rd_D1    Wrt_A2
    (-(A2+D2))->B6    // B6 = C2 + 2C3 + C4 - C6 - 2C7 - C0  Rd_A2  Rd_D2  Wrt_B6
                      //
//
// North East Mask Computation
// B5 = (-2)*C0 + (-1)*C1 + 0*C2 + 1*C3 + 2*C4 + 1*C5 + 0*C6 + (-1)*C7 + 0*D0
//
    (-C7)->B2                                      Rd_C7    Wrt_B2
    (-(B2+C3))->A2    // A2 = C7-C3                Rd_B2    Rd_C3    Wrt_A2
                      //
    (-C4)->B3                                      Rd_C4    Wrt_B3
    (-C4)->D1                                      Rd_C4    Wrt_D1
    (-(B3+D1))->A3    // A3 = 2*C4                 Rd_B3    Rd_D1    Wrt_A3
                      //
    (-C0)->B3                                      Rd_C0    Wrt_B3
    (-C0)->D1                                      Rd_C0    Wrt_D1
    (-(B3+D1))->A4    // A4 = 2*C0                 Rd_B3    Rd_D1    Wrt_A4
                      //
    (-C5)->B2                                      Rd_C5    Wrt_B2
    (-(B2+C1))->A5    // A5 = C5-C1                Rd_B2    Rd_C1    Wrt_A5
                      //
    (-A3)->B3                                      Rd_A3    Wrt_B3
    (-(A4+B3))->D1    // D1 = 2*C4 + (-2)*C0       Rd_A4    Rd_B3    Wrt_D1
                      //
```

TABLE 8-continued

Microcode and Mnemonics - Robinson compass mask on NitAPP/QNN

| | | | | | |
|---|---|---|---|---|---|
| (−A2)−>B3 | | Rd_A2 | Wrt_B3 | | |
| (−(A5+B3))−>D2 | // D2 = −C3 − C5 + C7 + C1 // | Rd_A5 | Rd_B3 | Wrt_D2 | |
| (−D1)−>A2 | | Rd_D1 | Wrt_A2 | | |
| (−(A2+D2))−>B5 | // B5 = C3 + 2C4 + C5 − C7 − 2C0 − C1 // | Rd_A2 | Rd_D2 | Wrt_B5 | |

//
// East Mask Computation
// B4 = (−1)*C0 + (−2)*C1 + (−1)*C2 + 0*C3 + 1*C4 + 2*C5 + 1*C6 + 0*C7 + 0*D0
//

| | | | | | |
|---|---|---|---|---|---|
| (−C0)−>B2 | | Rd_C0 | Wrt_B2 | | |
| (−(B2+C4))−>A2 | // A2 = C0−C4 // | Rd_B2 | Rd_C4 | Wrt_A2 | |
| (−C5)−>B3 | | Rd_C5 | Wrt_B3 | | |
| (−C5)−>D1 | | Rd_C5 | Wrt_D1 | | |
| (−(B3+D1))−>A3 | // A3 = 2*C5 // | Rd_B3 | Rd_D1 | Wrt_A3 | |
| (−C1)−>B3 | | Rd_C1 | Wrt_B3 | | |
| (−C1)−>D1 | | Rd_C1 | Wrt_D1 | | |
| (−(B3+D1))−>A4 | // A4 = 2*C1 // | Rd_B3 | Rd_D1 | Wrt_A4 | |
| (−C6)−>B2 | | Rd_C6 | Wrt_B2 | | |
| (−(B2+C2))−>A5 | // A5 = C6−C2 // | Rd_B2 | Rd_C2 | Wrt_A5 | |
| (−A3)−>B3 | | Rd_A3 | Wrt_B3 | | |
| (−(A4+B3))−>D1 | // D1 = 2*C5 + (−2)*C1 // | Rd_A4 | Rd_B3 | Wrt_D1 | |
| (−A2)−>B3 | | Rd_A2 | Wrt_B3 | | |
| (−(A5+B3))−>D2 | // D2 = −C4 − C6 + C0 + C2 // | Rd_A5 | Rd_B3 | Wrt_D2 | |
| (−D1)−>A2 | | Rd_D1 | Wrt_A2 | | |
| (−(A2+D2))−>B4 | // B4 = C4 + 2C5 + C6 − C0 − 2C1 − C2 // | Rd_A2 | Rd_D2 | Wrt_B4 | |

//
// Having completed four mask operations, the other four orientations are absolute values of the first four.
// The mask value for the pixel, therefore, is the maximum result of the absolute values of the first four masks.
//
// Compute the absolute value of the mask results.
//

| | | | | | |
|---|---|---|---|---|---|
| IF_B(B4) | | Rd_B4 | Enbl_FB | Wrt_FB | |
| (−B4)−>A4 | | Rd_B4 | Wrt_A4 | | |
| (−A4)−>D4 | | Rd_A4 | Wrt_D4 | | |
| (−D4)−>B4 | | Rd_D4 | Wrt_B4 | | |
| ENDIF_B | | Set_FB | | | |
| // | | | | | |
| IF_B(B5) | | Rd_B5 | Enbl_FB | Wrt_FB | |
| (−B5)−>A4 | | Rd_B5 | Wrt_A4 | | |
| (−A4)−>D4 | | Rd_A4 | Wrt_D4 | | |
| (−D4)−>B5 | | Rd_D4 | Wrt_B5 | | |
| ENDIF_B | | Set_FB | | | |
| // | | | | | |
| IF_B(B6) | | Rd_B6 | Enbl_FB | Wrt_FB | |
| (−B6)−>A4 | | Rd_B6 | Wrt_A4 | | |
| (−A4)−>D4 | | Rd_A4 | Wrt_D4 | | |
| (−D4)−>B6 | | Rd_D4 | Wrt_B6 | | |
| ENDIF_B | | Set_FB | | | |
| // | | | | | |
| IF_B(B7) | | Rd_B7 | Enbl_FB | Wrt_FB | |
| (−B7)−>A4 | | Rd_B7 | Wrt_A4 | | |
| (−A4)−>D4 | | Rd_A4 | Wrt_D4 | | |
| (−D4)−>B7 | | Rd_D4 | Wrt_B7 | | |
| ENDIF_B | | Set_FB | | | |

//
// Determine the value of the highest mask result.
//

| | | | | | |
|---|---|---|---|---|---|
| (−B4)−>D1 | // negate B4 | Rd_B4 | Wrt_D1 | | |
| IF_D(B5+D1) | // check if B5−B4>0 | Rd_B5 | Rd_D1 | Enbl_FD | Wrt_FD |
| (−B5)−>D1 | // if so, update max value | Rd_B5 | Wrt_D1 | | |
| ENDIF_D | | Set_FD | | | |
| IF_D(B6+D1) | // check if B6 > B4 or B5 | Rd_B6 | Rd_D1 | Enbl_FD | Wrt_FD |
| (−B6)−>D1 | // if so, update max value | Rd_B6 | Wrt_D1 | | |
| ENDIF_D | | Set_FD | | | |

TABLE 8-continued

Microcode and Mnemonics - Robinson compass mask on NitAPP/QNN

| IF_D(B7+D1) | // check if B7 > B4 or B5 or B6 | Rd_B7 | Rd_D1 | Enbl_FD | Wrt_FD |
| (-B7)->D1 | // if so, update max value | Rd_B7 | Wrt_D1 | | |
| ENDIF_D | | Set_FD | | | |
| // | | | | | |
| // Write result to SRAM | | | | | |
| // | | | | | |
| (-D1)->Result | | Rd_D1 | Wrt_Result | | |
| Result->ADC | | Wrt_ADC | | | |
| // | | | | | |
| // End of Robinson compass mask for NitAPP/QNN edge //detection | | | | | |
| // | | | | | |

Design criteria such as crosstalk, APP instruction bus frequency, APP instruction settling time, and semiconductor process geometry are important considerations when fabricating analog computing circuitry. Analog storage elements like analog registers are susceptible to noise from sources like parasitic capacitance, thermal variations, and fabrication process variation. In order to understand the effects of noise on the results of APP computing circuitry, a hardware simulator is used to inject selected amounts of noise in the APP computing process and analyze the results. A hardware simulator also allows a user to define the analog set points for A/D conversion, D/A conversion, and the maximum current-carrying capacity of analog registers.

Figure 15:
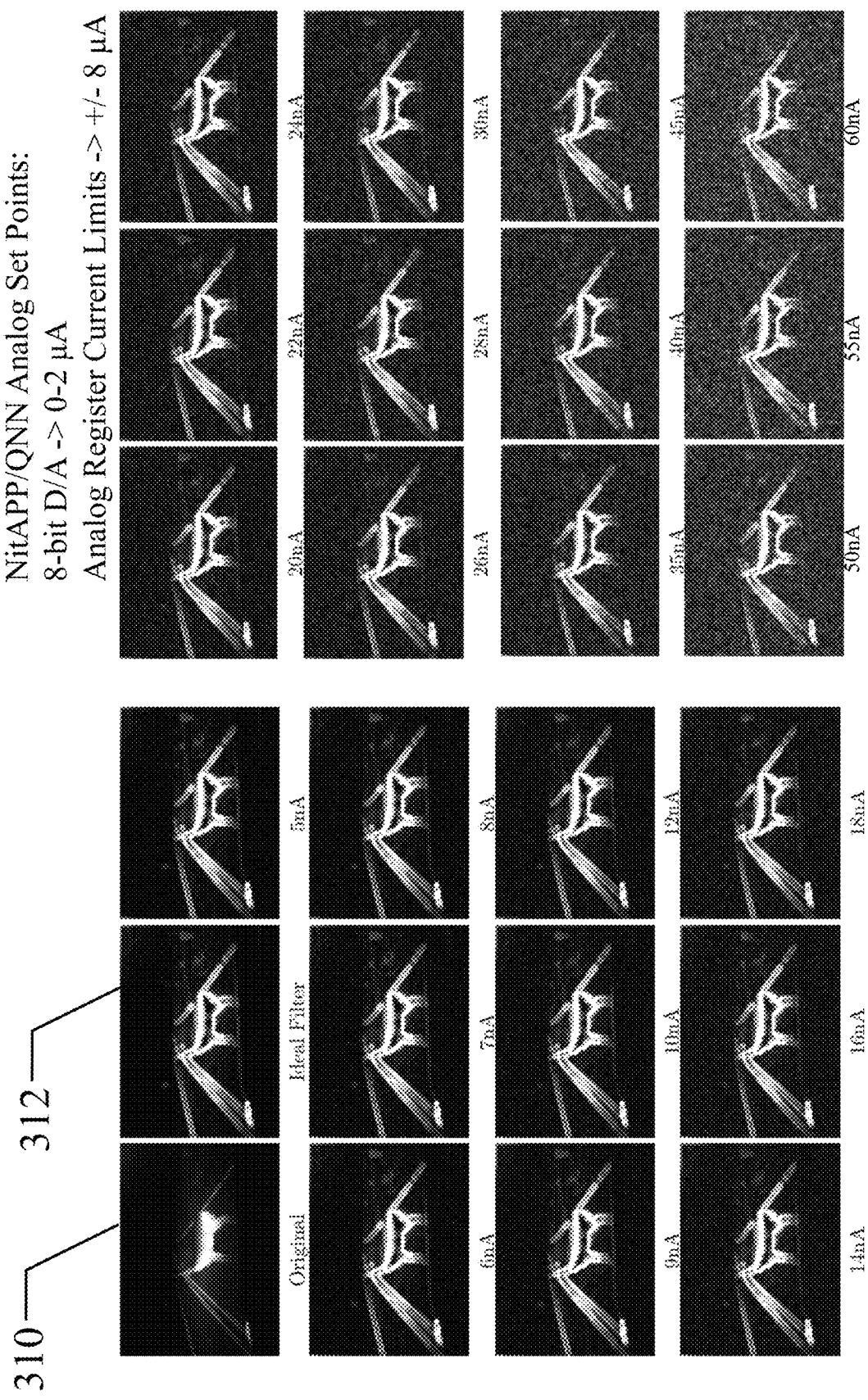
FIG. 15 illustrates hardware simulator output for analog pixel processing circuitry in accordance with an embodiment.

FIG. 15 shows an input image 310 and associated output from a NitAPP/QNN simulator with the set points from Table 9 below.

TABLE 9

Analog set points for NitAPP/QNN simulator for Robinson compass algorithm

| Parameter | Set Point |
| --- | --- |
| 8-bit D/A input | 0-2 µA |
| A/D output | 0-2 µA |
| Analog Register Current Capacity | −8 µA –> +8 µA |

A NitAPP/QNN simulator executes the Table 8 mnemonics for a Robinson compass mask and produces an ideal filter image 312 that shows the edge detection results. For subsequent executions in a simulator, a random amount of noise is introduced into the current level for every write operation. The introduced noise has a Gaussian distribution with an amplitude of 5 nA, 6 nA, 7 nA, 8 nA, 9, nA, 10 nA, 12 nA, 14 nA, 16 nA, 18, nA, 20 nA, 22 nA, 24 nA, 26 nA, 28 nA, 30 nA, 35 nA, 40 nA, 45 nA, 50 nA, 55 nA and 60 nA for outputs shown in FIG. 15.

Figure 16:
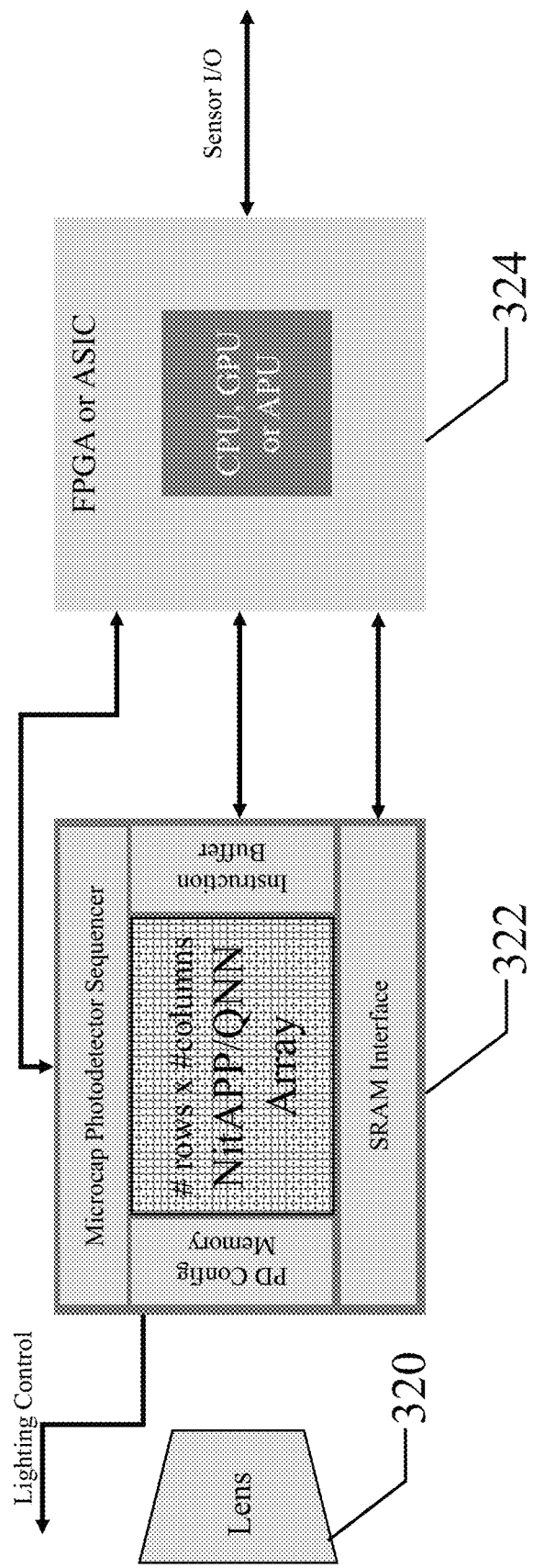
FIG. 16 illustrates a block diagram for an embodiment of a camera system utilizing an embodiment.

FIG. 16 illustrates a block diagram for an embodiment of a camera system produced from three components in accordance with embodiments as disclosed. A lens 320 focuses photons from a sensor's field of view onto a surface of exposed photodetectors. An FPGA (field programmable gate array) or an ASIC (application specific integrated circuit) 324 performs all sensor-specific computing and utilizes a NitAPP/QNN 322 to perform all neighbor-in-time computing from a plurality of sub-frames and corresponding neighbor-in-space computing prior to transferring processed information the FPGA or ASIC 324.

Figure 17:
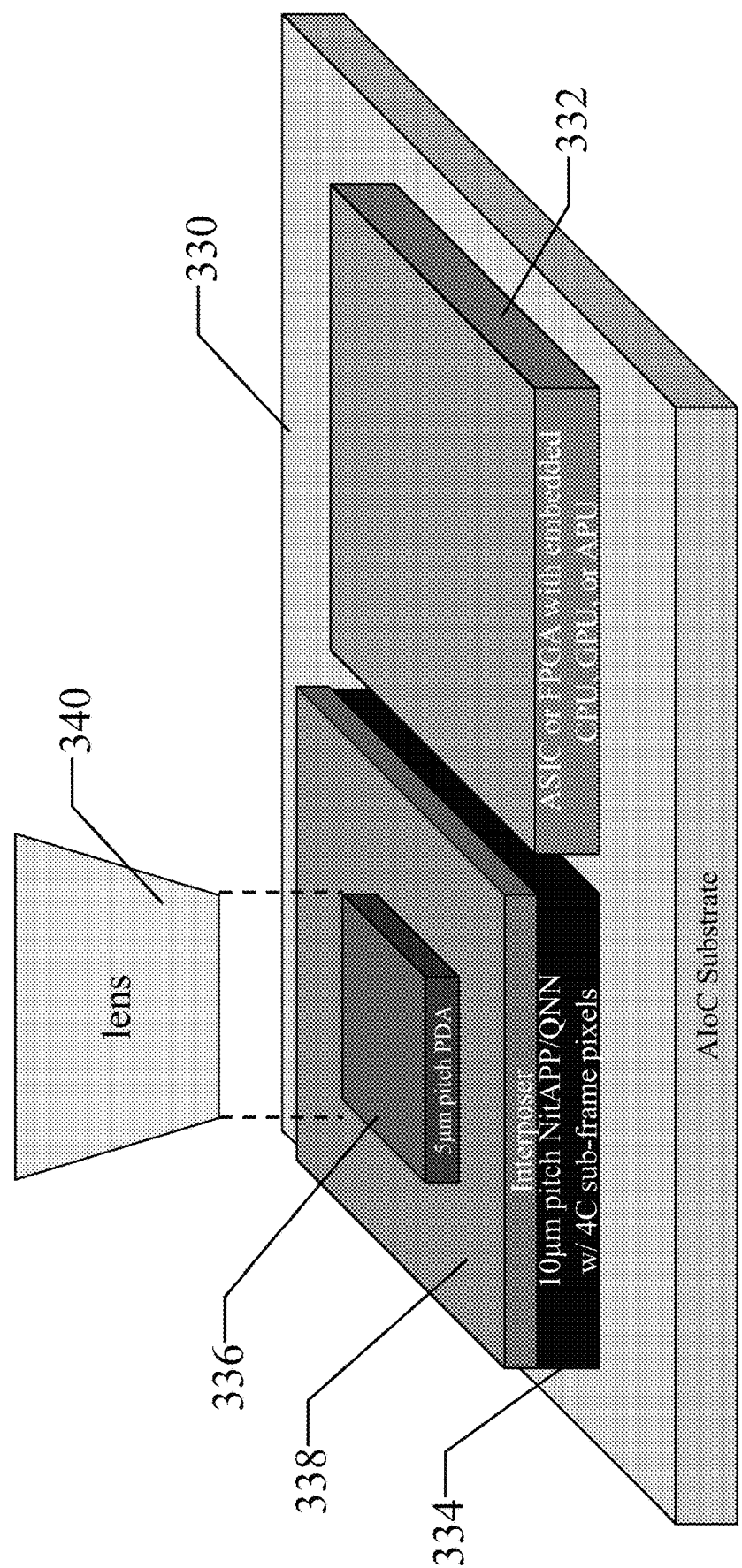
FIG. 17 illustrates an embodiment of AIoC (Artificial Intelligence on a Chip).

Artificial Intelligence (AI) hardware, software and imaging contained within a single module is referred to as AIoC (AI on a Chip) or AI SoC (System on Chip). FIG. 17 illustrates an embodiment of AIoC that uses NitAPP/QNN functionality. An AIoC substrate 330 contains the electrical interconnects necessary to incorporate the components of an AIoC. An FPGA (field programmable gate array) or an ASIC (application specific integrated circuit) 332 performs all sensor-specific computing and utilizes a NitAPP/QNN 334 to perform all neighbor-in-time computing from a plurality of sub-frames and corresponding neighbor-in-space computing prior to transferring processed information to an FPGA or ASIC 332. In embodiments, the pixel pitch of a NitAPP/QNN 334 array is larger than the pixel pitch of a photodetector array (PDA) 336. An interposer 338 is an interconnect layer that allows for electrical connections between the bottom pad connections of a PDA 336 and the TSVs (through-silicon vias) for photodetector connects to NitAPP/QNN 334. A lens 340 focuses photons from the AIoC's field of view onto a surface of exposed photodetectors.

Persons of ordinary skill in the relevant arts will recognize that embodiments may comprise fewer features than illustrated in any individual embodiment described above. The embodiments described herein are not meant to be an exhaustive presentation of the ways in which the various features of the embodiments may be combined. Accordingly, the embodiments are not mutually exclusive combinations of features; rather, embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of Section 112, sixth paragraph of 35 U.S.C. are not to be invoked unless the specific terms "means for" or "step for" are recited in a claim.

The invention claimed is:

1. A sub-frame imaging pixel comprising:
a photodetector;
photodetector control circuitry (PDC) comprising (i) at least three analog storage elements configured to store at least three sub-frames, wherein each of the at least three sub-frames includes analog data transferred from the photodetector, and (ii) a PDC instruction bus coupled to each of the at least three sub-frames and configured to control operations of the PDC on said analog data transferred from the photodetector; and
an analog pixel processor (APP) configured to process neighbor-in-space and neighbor-in-time functions on said analog data stored in the at least three sub-frames, the APP comprising:
at least two banks of analog registers configured to: (i) receive the analog data from the PDC, and (ii) perform (a) data transfer operations, and (b) one or more of math operations and logic operations on the analog data stored in the at least two banks of analog registers,
a compare-and-flag functional block for each of the at least two banks of analog registers, wherein write operations to a register amongst the at least two banks of analog registers are executed when a signal is active during a register write cycle,
north, east, west, and south (NEWS) registers configured to perform the data transfer operations between neighboring sub-frame imaging pixels to facilitate the neighbor-in-space functions on the analog data stored in the at least two banks of analog registers, and
an APP instruction bus that is separate and distinct from the PDC instruction bus and is configured to: (i) allow for concurrent processing of the analog data stored in two sub-frames of the at least three sub-frames, and (ii) execute each of the following: (a) the data transfer operations, (b) the math operations, (c) the logic operations, (d) the neighbor-in-space functions, and (e) the neighbor-in-time functions.

2. The sub-frame imaging pixel of claim 1, further comprising:
an analog-to-digital converter (ADC) configured to convert the analog data maintained in one or more of the at least two banks of analog registers to one or more multi-bit digital data values; and
a D/A converter (DAC) configured to convert the one or more multi-bit digital data values to the analog data.

3. The sub-frame imaging pixel of claim 2, further comprising: a digital storage (SRAM) operably coupled to the ADC and the DAC and configured to cause DAC-converted values to be enabled onto the APP instruction bus and to write ADC-converted values to the SRAM.

4. The sub-frame imaging pixel of claim 1, wherein:
the at least three analog storage elements implement integration circuitry, and
the PDC further comprises a fourth analog storage element that implements event circuitry.

5. The sub-frame imaging pixel of claim 1, wherein the at least two banks of analog registers comprise at least one of: (i) four banks of analog registers or (ii) eight banks of analog registers.

6. A semiconductor substrate for sub-frame imaging, including:
an array of sub-frame imaging pixels, wherein each of the sub-frame imaging pixels comprises:
a photodetector;
photodetector control circuitry (PDC) comprising (i) at least three analog storage elements configured to store at least three sub-frames, wherein each the at least three sub-frames includes analog data transferred from the photodetector, and (ii) a PDC instruction bus coupled to each of the at least three sub-frames and configured to control operations of the PDC on said analog data transferred from the photodetector;
an analog pixel processor (APP) configured to process neighbor-in-space and neighbor-in-time functions on said analog data stored in the at least three sub-frames, the APP comprising:
at least two banks of analog registers configured to: (i) receive the analog data from the PDC, and (ii) perform (a) data transfer operations, and (b) one or more of math operations and logic operations on the analog data stored in the at least two banks of analog registers,
a compare-and-flag functional block for each of the at least two banks of analog registers, wherein write operations to a register amongst the at least two banks of analog registers are executed when a signal is active during a register write cycle,
north, east, west, and south (NEWS) registers configured to perform the data transfer operations between neighboring sub-frame imaging pixels to facilitate the neighbor-in-space functions on the analog data stored in the at least two banks of analog registers, and
an APP instruction bus that is separate and distinct from the PDC instruction bus and is configured to: (i) allow for concurrent processing of the analog data stored in two sub-frames of the at least three sub-frames, and (ii) execute each of the following: (a) the data transfer operations, (b) the math operations, (c) the logic operations, (d) the neighbor-in-space functions, and (e) the neighbor-in-time functions;
a photodetector (PD) config memory configured to store information used for sequencing the PDC of each of the array of sub-frame imaging pixels; and
a PDC sequencer configured to step through the information stored in the PD config memory to sequence the PDC of each of the array of sub-frame imaging pixels.

7. The semiconductor substrate of claim 6, further comprising top-side vias at terminals of the photodetector.

8. The semiconductor substrate of claim 7, wherein the top-side vias comprise through-silicon vias (TSVs).

9. The semiconductor substrate of claim 6, wherein a pitch of the sub-frame imaging pixels ranges from 1.5 μm to 40 μm.

10. The semiconductor substrate of claim 6, wherein a number of sub-frame imaging pixels on a single device is as low as 1024 in a 32×32 grid pattern and as high as 268,435,456 in a 16,384×16,384 grid pattern.

11. A multi-frame imaging system on chip (SoC) comprising:
- an array of sub-frame imaging pixels, wherein each of the sub-frame imaging pixels comprises:
  - a photodetector;
  - photodetector control circuitry (PDC) comprising (i) at least three analog storage elements configured to store at least three sub-frames, wherein each of the at least three sub-frames includes analog data transferred from the photodetector, and (ii) a PDC instruction bus coupled to each of the at least three sub-frames and configured to control operations of the PDC on said analog data transferred from the photodetector;
  - an analog pixel processor (APP) configured to process neighbor-in-space and neighbor-in-time functions on said analog data stored in the at least three sub-frames, the APP comprising:
    - at least two banks of analog registers configured to: (i) receive the analog data from the PDC, and (ii) perform (a) data transfer operations, and (b) one or more of math operations and logic operations on the analog data stored in the at least two banks of analog registers,
    - a compare-and-flag functional block for each of the at least two banks of analog registers, wherein write operations to a register amongst the at least two banks of analog registers are executed when a signal is active during a register write cycle,
    - north, east, west, and south (NEWS) registers configured to perform the data transfer operations between neighboring sub-frame imaging pixels to facilitate the neighbor-in-space functions on the analog data stored in the at least two banks of analog registers, and
    - an APP instruction bus that is separate and distinct from the PDC instruction bus and is configured to: (i) allow for concurrent processing of the analog data stored in two sub-frames of the at least three sub-frames, and (ii) execute each of the following: (a) the data transfer operations, (b) the math operations, (c) the logic operations, (d) the neighbor-in-space functions, and (e) the neighbor-in-time functions; and
- a digital processor configured to perform additional processing operations using output from the array of sub-frame imaging pixels.

12. The SoC of claim 11, wherein the digital processor comprises at least one of a CPU, a GPU, an APU, an FPGA, or an ASIC.

13. The SoC of claim 11, wherein the digital processor comprises artificial intelligence (AI) software.

* * * * *